United States Patent
Takahashi

(10) Patent No.: US 8,677,612 B2
(45) Date of Patent: Mar. 25, 2014

(54) METHOD FOR MANUFACTURING FLEX-RIGID WIRING BOARD

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/291,134

(22) Filed: Nov. 8, 2011

(65) Prior Publication Data

US 2012/0047727 A1 Mar. 1, 2012

Related U.S. Application Data

(62) Division of application No. 12/496,141, filed on Jul. 1, 2009.

(60) Provisional application No. 61/140,754, filed on Dec. 24, 2008.

(51) Int. Cl.
*H05K 1/02* (2006.01)
*H05K 3/46* (2006.01)

(52) U.S. Cl.
USPC .......... 29/830; 29/847; 29/852; 174/254

(58) Field of Classification Search
USPC .......... 29/830, 846, 847, 852; 174/254
See application file for complete search history.

(56) References Cited

U.S. PATENT DOCUMENTS

| | | | |
|---|---|---|---|
| 4,587,719 A | 5/1986 | Barth | |
| 5,130,499 A | 7/1992 | Dijkshoorn | |
| 5,398,163 A | 3/1995 | Sano | |
| 5,795,299 A | 8/1998 | Eaton et al. | |
| 5,903,440 A | 5/1999 | Blazier et al. | |
| 6,969,806 B2 | 11/2005 | Dupriest | |
| 7,265,719 B1 | 9/2007 | Moosbrugger et al. | |
| 7,696,441 B2 | 4/2010 | Kataoka | |
| 8,058,560 B2 | 11/2011 | Lo et al. | |
| 2006/0225914 A1 | 10/2006 | Tan | |
| 2008/0093118 A1* | 4/2008 | Takahashi et al. | 174/264 |
| 2008/0287767 A1* | 11/2008 | Pasveer et al. | 600/372 |
| 2008/0289859 A1 | 11/2008 | Mikado et al. | |
| 2009/0120670 A1 | 5/2009 | Lo et al. | |
| 2009/0236126 A1 | 9/2009 | Miyahara | |

FOREIGN PATENT DOCUMENTS

| | | |
|---|---|---|
| JP | 7-183663 | 7/1995 |
| JP | 8-130352 | 5/1996 |
| JP | 2004-172208 | 6/2004 |
| JP | 2006-005134 | 1/2006 |
| JP | 2006005134 A * | 1/2006 |
| JP | 4021472 | 12/2007 |

OTHER PUBLICATIONS

U.S. Appl. No. 13/297,311, filed Nov. 16, 2011, Takahashi.

* cited by examiner

*Primary Examiner* — Livius R Cazan

(74) *Attorney, Agent, or Firm* — Oblon, Spivak, McClelland, Maier & Neustadt, L.L.P.

(57) ABSTRACT

A method for manufacturing a flex-rigid wiring board, including preparing a flexible wiring board having a flexible base material and having a conductive layer over the flexible base material, making a cut in the flexible wiring board to form a cut portion, and folding at least one portion of the flexible wiring board using the cut portion to form one or more folding portions such that the flexible wiring board is extended in length, and connecting the flexible wiring board to a rigid wiring board including a rigid base material and having a conductive layer over the rigid base material.

20 Claims, 26 Drawing Sheets

METHOD FOR MANUFACTURING FLEX-RIGID WIRING BOARD

CROSS-REFERENCE TO RELATED APPLICATIONS

The present application is a divisional of and claims the benefit of priority to U.S. application Ser. No. 12/496,141, filed Jul. 1, 2009, which is based upon and claims the benefit of priority to U.S. Application No. 61/140,754, filed Dec. 24, 2008. The contents of these applications are incorporated herein by reference in their entirety.

BACKGROUND OF THE INVENTION

1. Field of the Invention

The present invention is related to a flex-rigid wiring board structured with a rigid wiring board and a flexible wiring board, and its manufacturing method.

2. Discussion of the Background

In Japanese Laid-Open Patent Publication 2006-5134, a flexible wiring board is described whose length is extended by making a cut. Such a flexible wiring board is formed with a flexible base material and a wiring pattern formed on the flexible base material. Here, the flexible base material has a cut in the area where the wiring pattern is not formed, and by folding from the tip of the cut, the flexible wiring board is extended to be longer than it was before folding. The contents of this publication are incorporated herein by reference in their entirety.

SUMMARY OF THE INVENTION

According to one aspect of the present invention, a flex-rigid wiring board includes a flexible wiring board including a rigid wiring board including a rigid base material and having a conductive layer over the rigid base material, and a flexible base material and having a conductive layer over the flexible base material. The conductive layer of the flexible wiring board is electrically connected to the conductive layer of the rigid wiring board. The flexible wiring board has a cut portion and one or more folding portions formed by using the cut portion and folding one or more portions of the flexible wiring board such that the flexible wiring board is extended in length.

According to another aspect of the present invention, a method for manufacturing a flex-rigid wiring board includes preparing a flexible wiring board including a flexible base material and having a conductive layer over the flexible base material, making a cut in the flexible wiring board to form a cut portion, and folding one or more portions of the flexible wiring board using the cut portion to form one or more folding portions such that the flexible wiring board is extended in length, and connecting the flexible wiring board to a rigid wiring board including a rigid base material and having a conductive layer over the rigid base material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
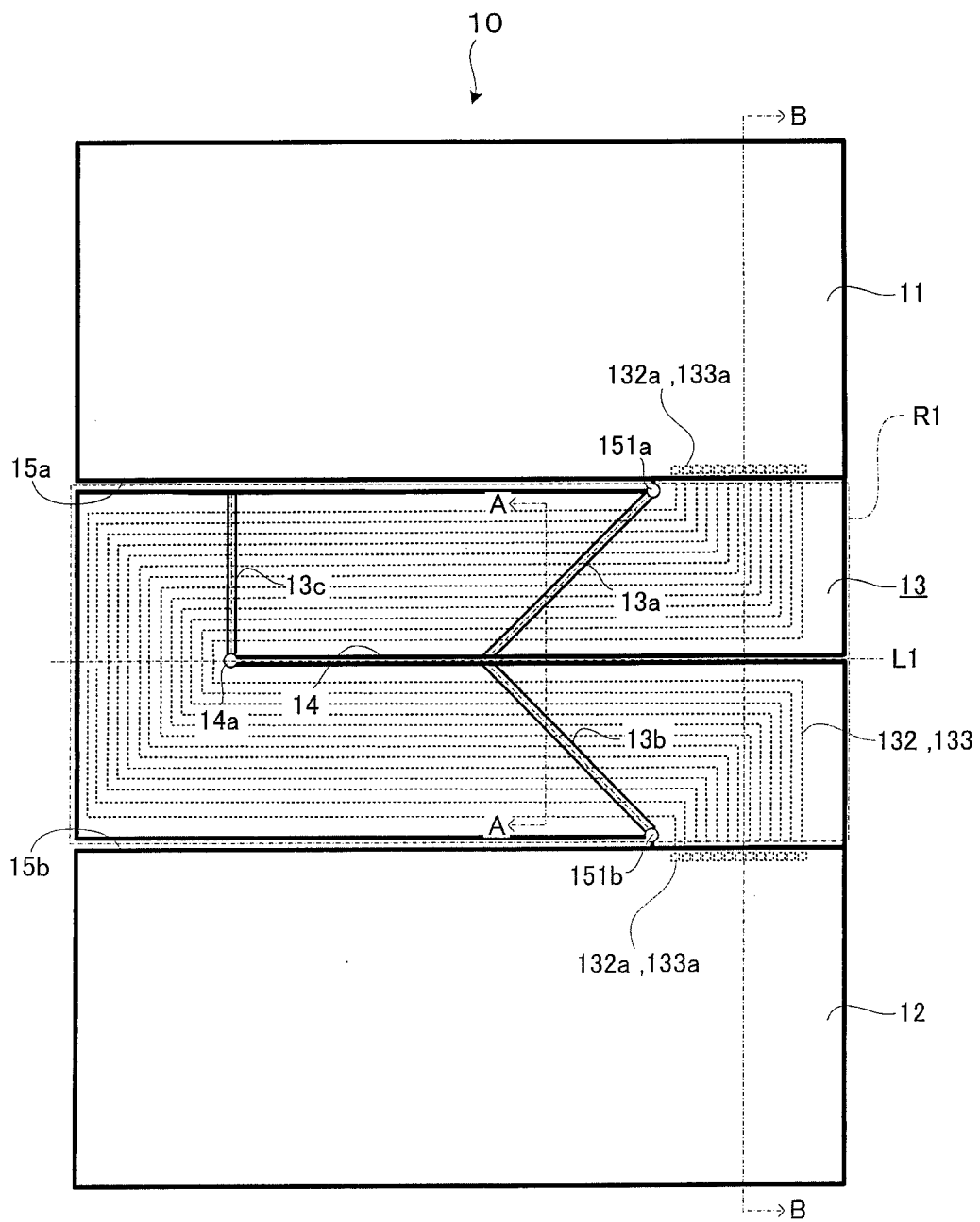
FIG. 1 is a plan view showing a flex-rigid wiring board according to an embodiment of the present invention.

The embodiments will now be described with reference to the accompanying drawings, wherein like reference numerals designate corresponding or identical elements throughout the various drawings.

As shown in FIG. 1, flex-rigid wiring board 10 of the present embodiment is formed with first rigid wiring board 11, second rigid wiring board 12 and flexible wiring board 13. First and second rigid wiring boards 11, 12 and flexible wiring board 13 are arranged horizontally without touching each other.

First rigid wiring board 11 and second rigid wiring board 12 are arranged facing each other by sandwiching flexible wiring board 13. Namely, the main section of flexible wiring board 13 is exposed in region (R1) between first rigid wiring board 11 and second rigid wiring board 12. Both tips of flexible wiring board 13 are connected to first rigid wiring board 11 and second rigid wiring board 12 respectively. Namely, first rigid wiring board 11 and second rigid wiring board 12 are connected to each other by means of flexible wiring board 13.

First and second rigid wiring boards 11, 12 may have circuit patterns (conductive patterns) of any type. By contrast, flexible wiring board 13 has striped wiring patterns (conductive layers 132, 133) on its front and back surfaces respectively. In addition, wiring patterns of flexible wiring board 13 have connection pads (132a, 133a) at each tip. Circuit patterns of first rigid wiring board 11 and circuit patterns of second rigid wiring board 12 are electrically connected to connection pads (132a, 133a).

The external shape of flexible wiring board 13 is configured to be a "U" which is line symmetrical to median line (L1) between first rigid wiring board 11 and second rigid wiring board 12. Namely, in rectangular flexible wiring board 13, cut 14 is formed along median line (L1). Between flexible wiring board 13 and first rigid wiring board 11 or between flexible wiring board 13 and second rigid wiring board 12, a predetermined gap, slit-like space (15a) or (15b) is formed. In region (R1), flexible wiring board 13 is formed along one side of first rigid wiring board 11 or second rigid wiring board 12 (specifically, the side to which flexible wiring board 13 is connected), and makes a U-turn at the end of first rigid wiring board 11 or second rigid wiring board 12 so as to be formed entirely in rectangular region (R1). The above wiring patterns (conductive layers 132, 133) are also formed U-shaped along the external shape of flexible wiring board 13.

Each tip (14a, 151a, 151b) of cut 14 and spaces (15a, 15b) is beveled and rounded. In doing so, stress concentration is eased when the flexible wiring board is bent.

As described, in flex-rigid wiring board 10, since the space (region (R1)) between first and second wiring boards 11, 12 is efficiently used, dead space seldom occurs in region (R1). Accordingly, when flexible wiring boards 13 of extended length are manufactured, the number of units manufactured may be substantially the same as when flexible wiring boards of shorter length are manufactured. Namely, the number of products manufactured per unit material increases.

Flexible wiring board 13 has folding sections (13a-13c) which can be bent more easily than other sections. Specifically, flexible wiring board 13 has a laminated structure (later described in detail) including electromagnetic-wave shielding layers, and such shielding layers are removed from folding sections (13a-13c). Since the shielding layers are more rigid than other layers of flexible wiring board 13, folding sections (13a-13c) may become more bendable by removing such shielding layers. Folding sections (13a-13c) are laid out in such a way that, by being folded at folding sections (13a-13c), flexible wiring board 13 will be extended to be longer than it was before folding (see FIG. 6 which will be described later).

Figure 2:
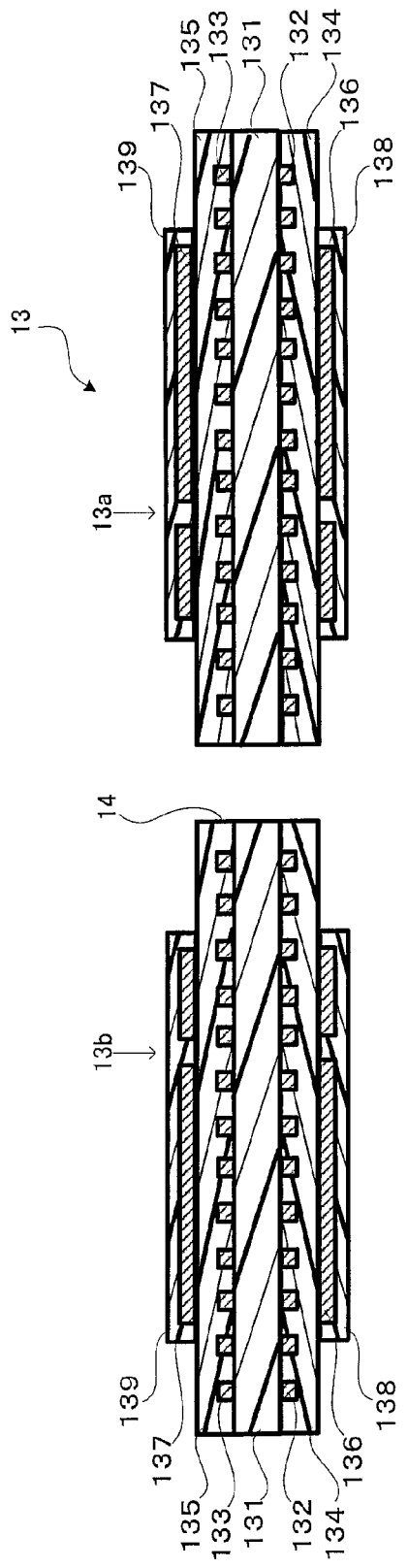
FIG. 2 is a cross-sectional view seen from the "A-A" line of FIG. 1.

Flexible wiring board 13, as its detailed structure shows in FIG. 2 (cross-sectional view seen from the "A-A" line in FIG. 1), for example, is formed by laminating flexible base material 131, conductive layers 132, 133, insulative films 134, 135, shielding layers 136, 137 and coverlays 138, 139.

Flexible base material 131 is formed by an insulative flexible sheet, for example, a polyimide sheet with a thickness of 20-50 μm, preferably approximately 30 μm.

Conductive layers 132, 133 are made of, for example, a copper pattern with an approximate thickness of 5-15 μm. By forming conductive layers 132, 133 on the front and back surfaces of flexible base material 131 respectively, the above-described striped wiring patterns are formed.

Insulative films 134, 135 are formed with a polyimide film with an approximate thickness of 5-15 μm. Insulative films 134, 135 insulate conductive layers 132, 133 from the outside.

Shielding layers 136, 137 are formed with a conductive layer, for example, a cured film of silver paste. Shielding layers 136, 137 will shield conductive layers 132, 133 from external electromagnetic noise as well as shield electromagnetic noise from conductive layers 132, 133 to the outside. Shielding layers 136, 137 are removed from folding sections (13a, 13c) (FIG. 1).

Coverlays 138, 139 are formed with insulative film such as polyimide with an approximate thickness of 5-15 μm. Coverlays 138, 139 will insulate as well as protect the entire flexible wiring board 13 from the outside.

Figure 3:
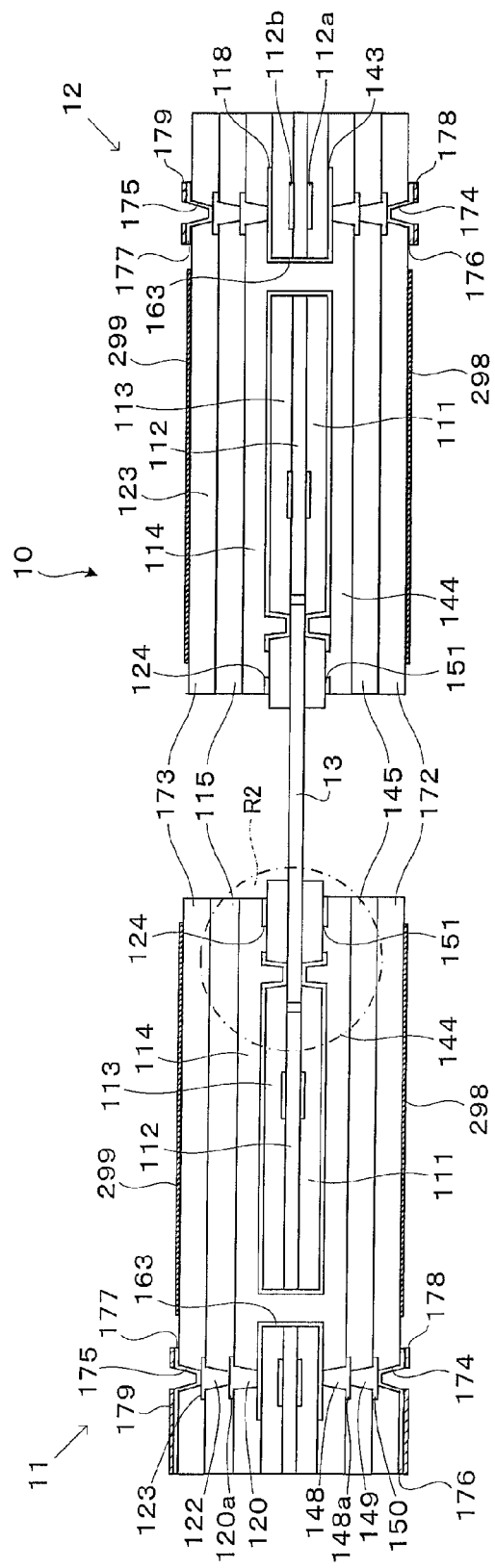
FIG. 3 is a cross-sectional view seen from the "B-B" line of FIG. 1.

Meanwhile, first and second rigid wiring boards 11, 12 are each a so-called built-up multilayer printed wiring board as shown in FIG. 3 (cross-sectional view seen from the "B-B" line in FIG. 1). Specifically, first and second wiring boards 11, 12 are each formed by laminating rigid base material 112, first and second insulation layers 111, 113, first and second upper-layer insulation layers 144, 114, third and fourth upper-layer insulation layers 145, 115, and fifth and sixth upper-layer insulation layers 172, 173.

Rigid base material 112 provides rigidity for first and second rigid wiring boards 11, 12. Rigid base material 112 is formed with a rigid insulative material. Specifically, rigid base material 112 is formed with, for example, glass-epoxy resin or the like with a thickness of 50-150 μm, preferably approximately 100 μm. Rigid base material 112 has substantially the same thickness as that of flexible wiring board 13. Also, on front and back of rigid base material 112, conductive patterns (112a, 112b) made of copper, for example, are formed respectively. Conductive patterns (112a, 112b) are electrically connected to further upper-layer conductors (wiring) at their respective predetermined spots.

First and second insulation layers 111, 113 are formed with a cured prepreg. First and second insulation layers 111, 113 each have a thickness of 50-100 μm, preferably approximately 50 μm. The prepreg is preferred to contain a resin with low-flow characteristics. Such a prepreg may be made by impregnating glass cloth with epoxy resin and thermosetting the resin beforehand to advance the curing degree. Also, such a prepreg may be made by impregnating glass cloth with a highly viscous resin, or by impregnating glass cloth with a resin containing inorganic filler (such as silica filler), or by reducing the amount of resin used to impregnate glass cloth.

Rigid base material 112 and first and second insulation layers 111, 113 form a core for first and second rigid wiring boards 11, 12 and support first and second rigid wiring boards 11, 12. In such core sections, through-holes (penetrating holes) 163 are formed, electrically connecting the conductive patterns on both surfaces (two main surfaces) of the wiring board to each other.

First and second rigid wiring boards 11, 12 and flexible wiring board 13 are connected at the core sections of first and second rigid wiring boards 11, 12. First and second insulation layers 111, 113 sandwich each tip portion of flexible wiring board 13 to support and secure them. Specifically, as region (R2) (the connected area between first rigid wiring board 11 and flexible wiring board 13) in FIG. 3 is magnified in FIG. 4, first and second insulation layers 111, 113 cover the boundary areas between rigid base material 112 and flexible wiring board 13 from both the front and back, while exposing part of flexible wiring board 13. First and second insulation layers 111, 113 are polymerized with coverlays 138, 139 formed on the surfaces of flexible wiring board 13.

The structure of the connected section between second rigid wiring board 12 and flexible wiring board 13 is the same as the structure of the connected section between first rigid wiring board 11 and flexible wiring board 13. Therefore, only the structure of the connected section (FIG. 4) between first rigid wiring board 11 and flexible wiring board 13 will be described in detail, and a detailed description of the other connected section will be omitted here.

Figure 4:
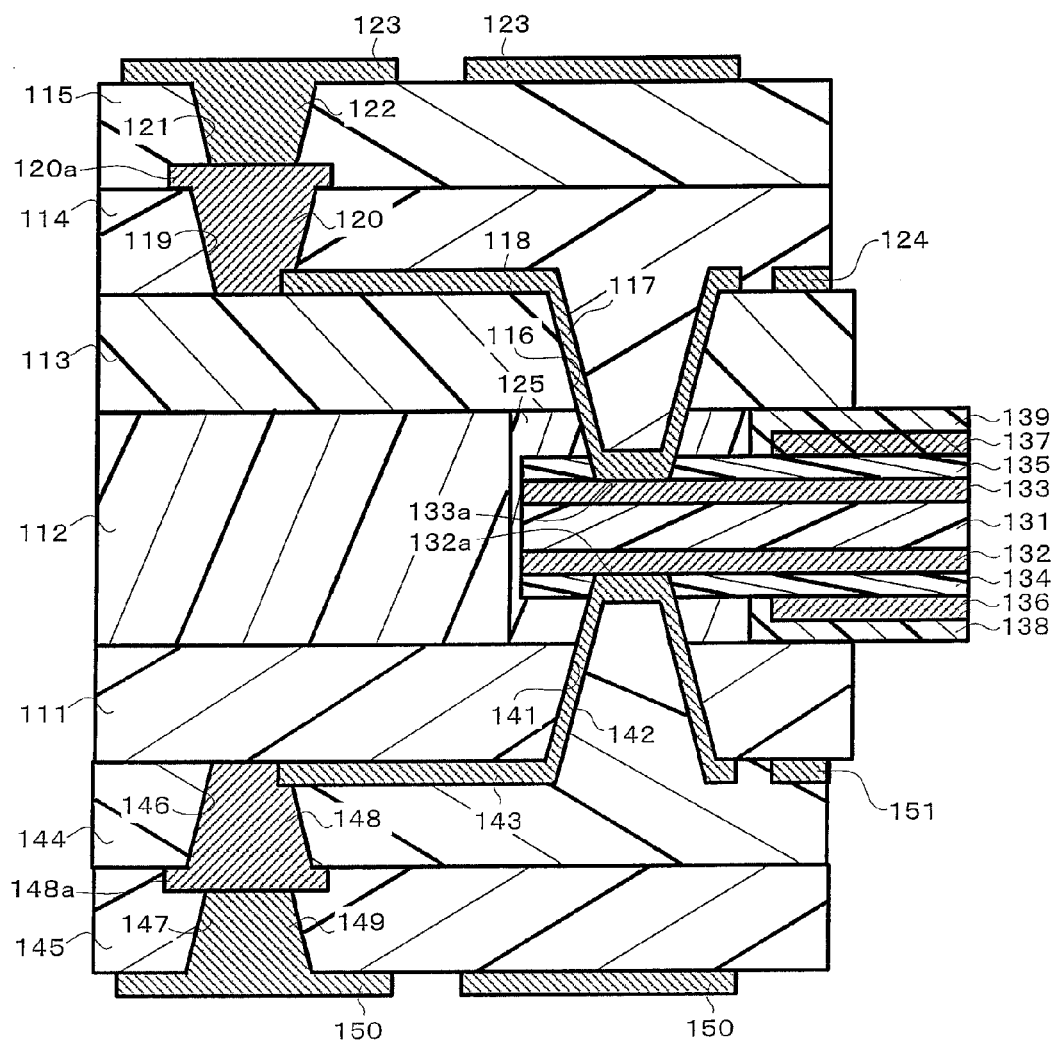
FIG. 4 is a partially magnified view of FIG. 3.

In the space compartmentalized by rigid base material 112, flexible wiring board 13 and first and second insulation layers 111, 113 (gaps between such members), resin 125 is filled as shown in FIG. 4. Resin 125 seeps, for example, from the low-flow prepreg that forms first and second insulation layers 111, 113 during the manufacturing process, and is cured to be integrated with first and second insulation layers 111, 113.

First and second insulation layers 111, 113 each have a tapered via hole (contact hole) 141, 116 in the portions that respectively face connection pads (132a, 133a) of flexible wiring board 13. From the portions which face via holes 141, 116, shielding layers 136, 137 and coverlays 138, 139 of flexible wiring board 13 are removed. Via holes 141, 116 penetrate insulative films 134, 135 of flexible wiring board 13 respectively and expose their respective connection pads (132a, 133a) of conductive layers 132, 133.

In each interior surface of via holes 141, 116, wiring patterns (conductive layers) 142, 117 made of copper plating, for example, are formed respectively. The plated films of wiring patterns 142, 117 are connected to connection pads (132a, 133a) respectively. Also, resin is filled in via holes 141, 116. Such resin inside via holes 141, 116 is filled by pressing to squeeze out the resin from upper-layer insulation layers (first and second upper-layer insulation layers 144, 114).

Furthermore, on each top surface of first and second insulation layers 111, 113, extended patterns 143, 118, which are connected respectively to wiring patterns 142, 117, are formed. Extended patterns 143, 118 are formed with, for example, copper plating or the like. Also, at the edges of first and second insulation layers 111, 113 closer to flexible substrate 13, namely, at the areas closer to substrate 13 beyond the boundary between flexible substrate 13 and rigid base material 112, conductive patterns 151, 124 insulated from the rest are arranged respectively. Heat generated in first rigid wiring board 11 is effectively radiated through conductive patterns 151, 124.

As such, first and second rigid wiring boards 11, 12 and flexible wiring board 13 are electrically connected without using connectors. Therefore, even when impact from being dropped or the like is received, faulty connection due to disconnected connectors will not occur.

Also, since flexible wiring board 13 is inserted into (is embedded in) first and second rigid wiring boards 11, 12 respectively, flexible wiring board 13 is electrically connected to first and second rigid wiring boards 11, 12 at the inserted portion (embedded portion). In doing so, the connected portions are adhered and reinforced by first and second rigid wiring boards 11, 12. Accordingly, when flex-rigid wiring board 10 receives impact from being dropped, or when ambient temperatures change and stress is generated due to the different CTEs (coefficients of thermal expansion) between first and second rigid wiring boards 11, 12 and flexible wiring board 13, electrical connections between flexible wiring board 13 and first and second rigid wiring boards 11, 12 may be maintained even more securely.

Also, since conductive layers 132, 133 and wiring patterns 142, 117 are connected through plated film, reliability at the connected portions is high.

In addition, by making connections through tapered via holes 141, 116, when stress is received from impact it will be dispersed, in contrast to connections by means of through-holes. Accordingly, cracking or the like will seldom occur. Moreover, by filling resin (first and second upper-layer insulation layers 144, 114) into via holes 141, 116, connection reliability will increase.

On each upper surface of first and second insulation layers 111, 113, as shown in FIG. 4, first and second upper-layer insulation layers 144, 114 are laminated respectively. In first and second upper-layer insulation layers 144, 114, via holes (first upper-layer via holes) 146, 119 are formed so as to be connected to extended patterns 143, 118 respectively. Furthermore, in via holes 146, 119, conductors 148, 120 made of copper, for example, are filled respectively. In addition, on each upper surface of first and second upper-layer insulation layers 144, 114, conductive patterns (148a, 120a) which are contiguous to conductors 148, 120 are formed respectively.

On first and second upper-layer insulation layers 144, 114, third and fourth upper-layer insulation layers 145, 115 are further laminated. In third and fourth upper-layer insulation layers 145, 115, via holes (second upper-layer via holes) 147, 121 are formed to be connected to via holes 146, 119. In via holes 147, 121, conductors 149, 122 made of copper, for example, are filled respectively. Also, conductors 149, 122 are electrically connected to conductors 148, 120 respectively. Accordingly, filled built-up via holes are formed by via holes 146, 147 and 119, 121.

First and second upper-layer insulation layers 144, 114, and third and fourth upper-layer insulation layers 145, 115 are formed by curing prepreg, for example.

On the upper surface of third and fourth upper-layer insulation layers 145, 115, conductive patterns (circuit patterns) 150, 123 are formed respectively. Then, to predetermined spots of conductive patterns 150, 123, via holes 147, 121 are connected. By doing so, conductive layer 133 and conductive pattern 123 are electrically connected by means of wiring pattern 117, extended pattern 118, conductor 120 and conductor 122; and also electrically connected are conductive layer 132 and conductive pattern 150 by means of wiring pattern 142, extended pattern 143, conductor 148 and conductor 149.

On each upper surface of third and fourth upper-layer insulation layers 145, 115, fifth and sixth upper-layer insulation layers 172, 173 are further laminated as shown in FIG. 3. Fifth and sixth upper-layer insulation layers 172, 173 are each formed by curing prepreg, for example.

In fifth and sixth upper-layer insulation layers 172, 173, via holes (third upper-layer via holes) 174, 175 are formed respectively which are connected to via holes 147, 121 respectively. Then, conductive patterns 176, 177 made of copper, for example, which include interiors of via holes 174, 175 are formed respectively on the front and back surfaces of the wiring board. Conductive patterns 176, 177 are electrically connected to conductors 149, 122 respectively. Moreover, on the front and back surfaces of the wiring board, patterned solder resists 298, 299 are formed respectively.

Also, on predetermined spots of conductive patterns 176, 177, electrodes (connection terminals) 178, 179 are formed by, for example, chemical gold plating. Such connection terminals are formed on both surfaces of first and second rigid wiring boards 11, 12.

Figure 5:
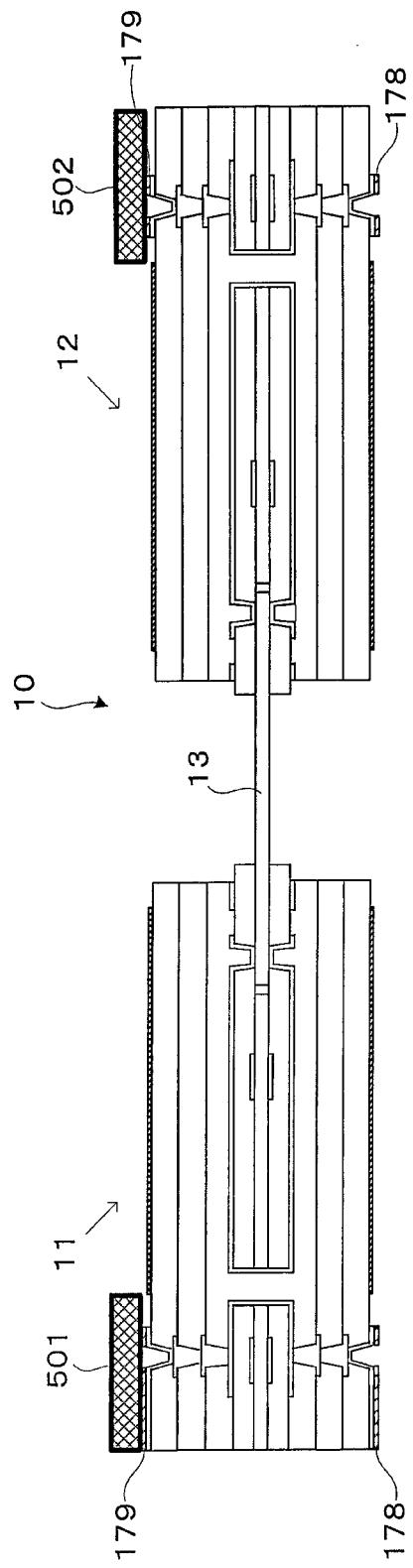
FIG. 5 is a view showing a flex-rigid wiring board with mounted electronic components.
Figure 6:
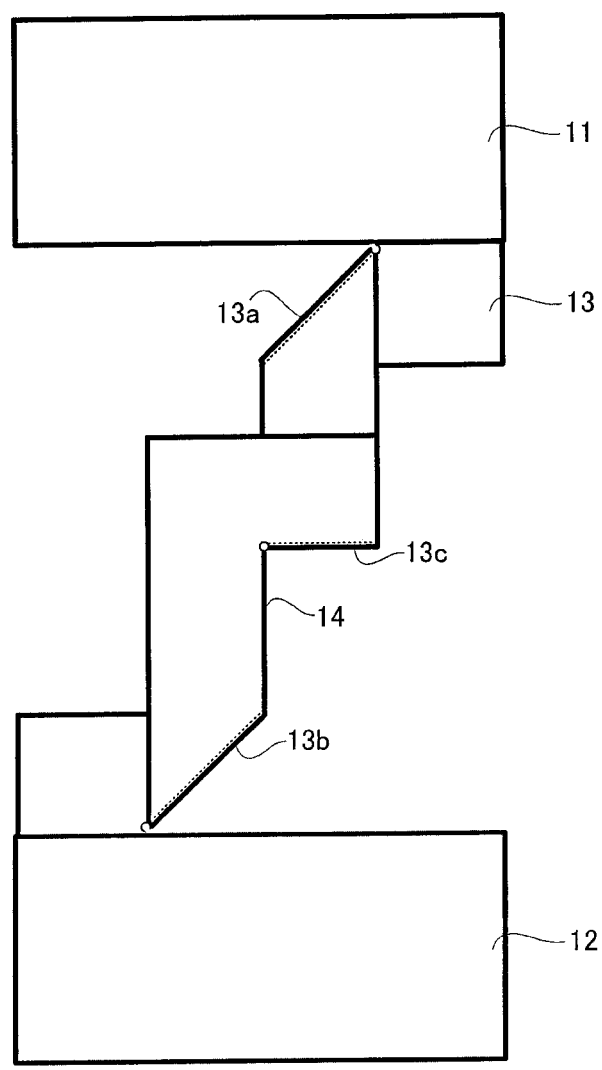
FIG. 6 is a view showing an extended flex-rigid wiring board.

When using such flex-rigid wiring board 10, electronic components 501, 502 are mounted respectively, for example, on surfaces (electrodes 179) of first and second rigid wiring boards 11, 12 as shown in FIG. 5. Such electronic components 501, 502 are, for example, active components such as an IC circuit, or passive components such as a resistor, capacitor, coil or the like. Moreover, after electronic components 501, 502 are mounted, flexible wiring board 13 is folded at folding sections (13a-13c) as shown in FIG. 6, for example. In doing so, flexible wiring board 13 is extended to be longer than it was before such a folding process. Then, flex-rigid wiring board 10 is sealed in a package to be mounted on, for example, a motherboard, by means of electrodes 178, then loaded into a cell phone or the like. The purpose or usage of flex-rigid wiring board 10 shown here is merely an example, and the present invention is not limited to such.

As described, flex-rigid wiring board 10 may mount electronic components on the surfaces (electrodes 179) of first and second rigid wiring boards 11, 12 (see FIG. 5). By doing so, aligning electronic components will become easier than in a case where electronic components are mounted on a flexible wiring board.

Figure 7:
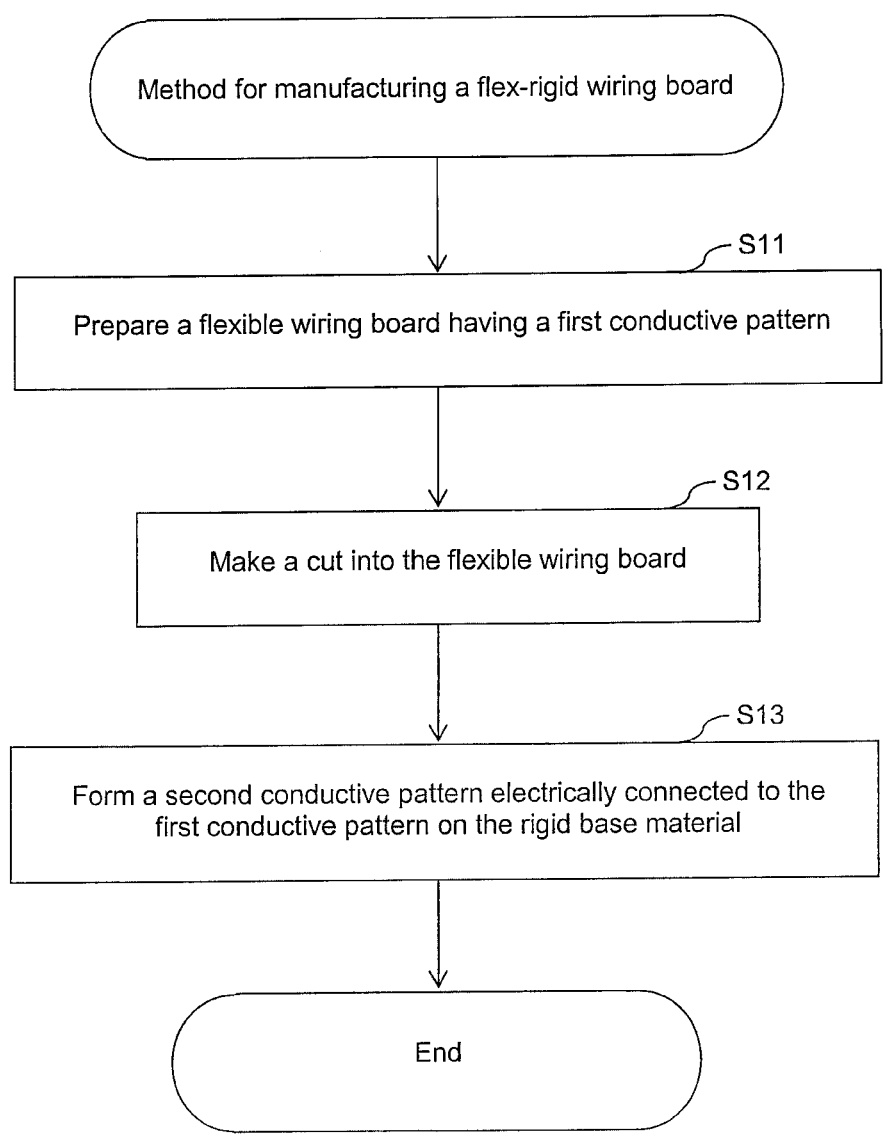
FIG. 7 is a flow chart showing the steps of a method for manufacturing a flex-rigid wiring board according to an embodiment of the present invention.

When manufacturing flex-rigid wiring board 10, a production worker, for example, will carry out a series of procedures as shown in FIG. 7.

Figure 8A:
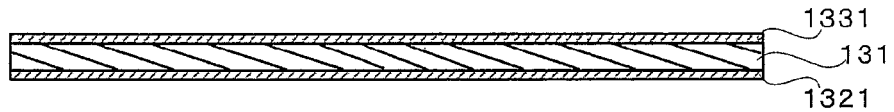
FIGS. 8A-8F are views to illustrate steps to manufacture a flexible wiring board.
Figure 8B:
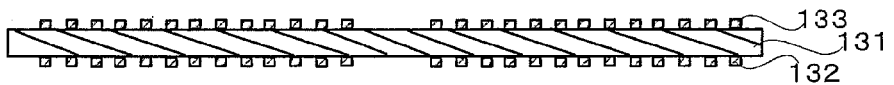
Figure 8C:
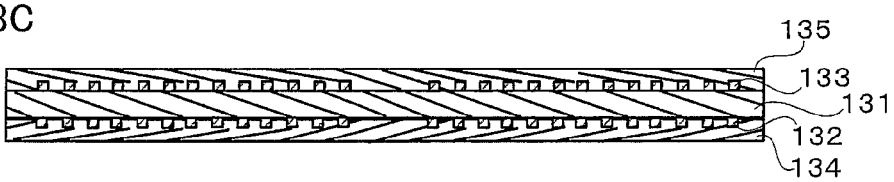
Figure 8D:
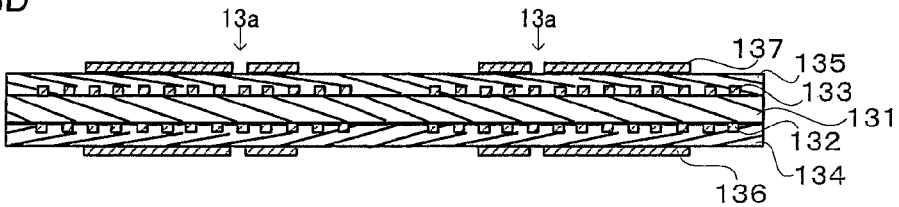
Figure 8E:
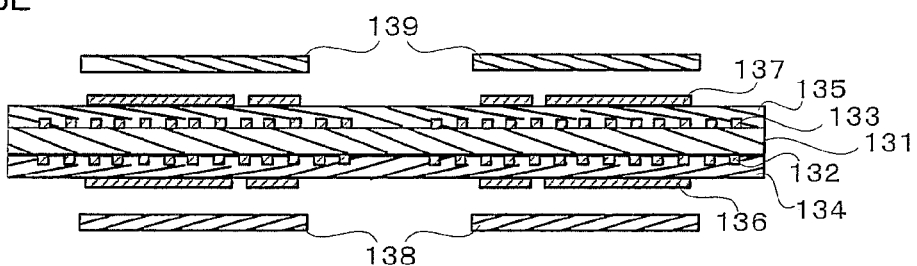

First, the worker prepares (manufactures) flexible wiring board 13 (FIG. 2) at step (S11). Specifically, as shown in FIG. 8A, copper films 1321, 1331 are formed on both surfaces of flexible base material 131 made of polyimide processed to a predetermined size. Then, as shown in FIG. 8B, by patterning copper films 1321, 1331, conductive layers 132, 133 (first conductive patterns) having connection pads (132a, 133a) (FIG. 1) are formed. Then, as shown in FIG. 8C, insulative films 134, 135 made of polyimide, for example, are formed by being laminated on the surfaces of conductive layers 132, 133 respectively. Moreover, as shown in FIG. 8D, silver paste is applied on insulative films 134, 135, and shielding layers 136, 137 are formed by curing the applied silver paste. At that time, shielding layers 136, 137 at folding sections (13a-13c) (FIG. 1) are removed by screen printing or etching after application. Then, as shown in FIG. 8E, coverlays 138, 139 are formed to cover the surfaces of shielding layers 136, 137 respectively. Here, shielding layers 136, 137 and coverlays 138, 139 are formed to avoid connection pads (132a, 133a).

Figure 8F:
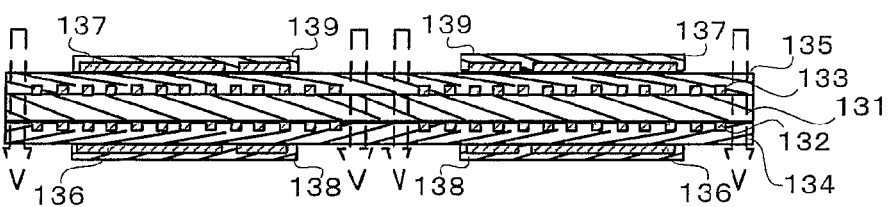

In the following, the worker makes cut 14 (FIG. 1) into flexible base material 131 at step (S12) in FIG. 7. Specifically, as shown in FIG. 8F, using a laser or the like, cut 14 (FIG. 1) is made while flexible wiring board 13 is cut to a predetermined size and configuration. During that time, each tip (14a, 151a, 151b) of cut 14 and gaps (15a, 15b) is beveled. In doing so, flexible wiring board 13 is completed as previously shown in FIG. 2.

In the following, the worker bonds flexible wiring board 13 and first and second rigid wiring board 11, 12 respectively at step (S13) of FIG. 7. During such bonding step, the worker forms second conductive patterns which will be electrically connected to conductive layers 132, 133 of flexible wiring board 13: namely, extended patterns 118, 143, conductive patterns (148a, 120a), conductive patterns 150, 123 and conductive patterns 176, 177 are formed on rigid base material 112 in that order.

Figure 9:
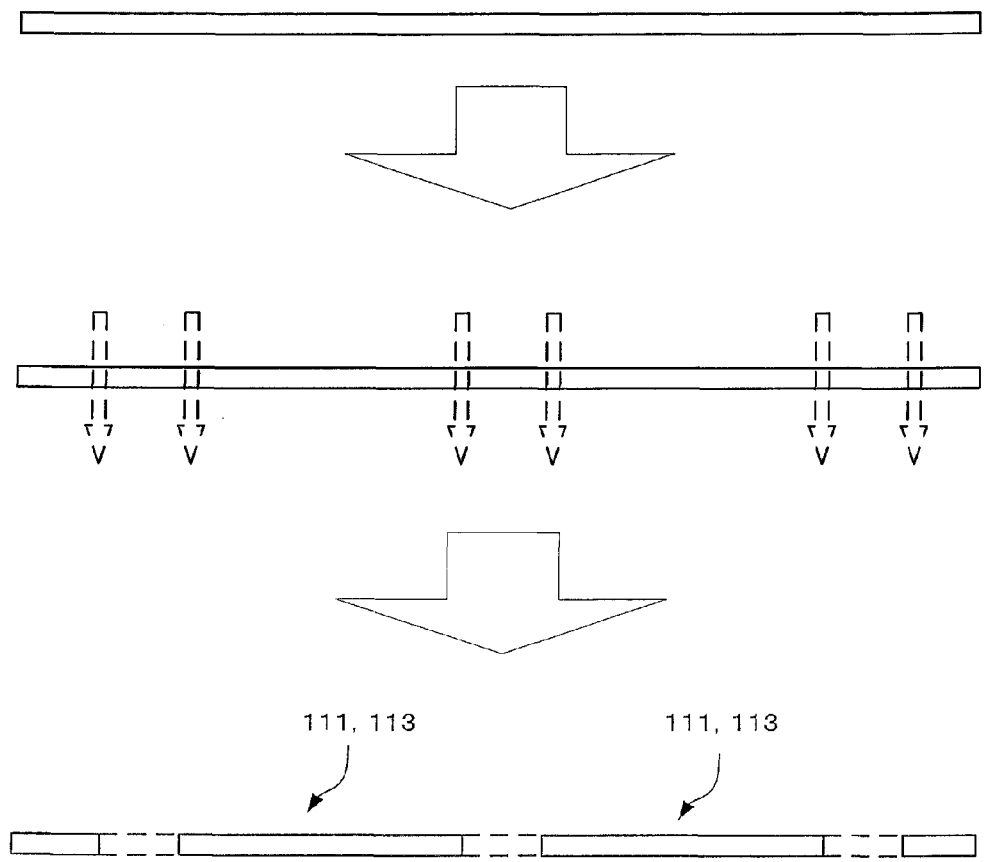
FIG. 9 is views to illustrate a step to cut out first and second insulation layers.
Figure 10:
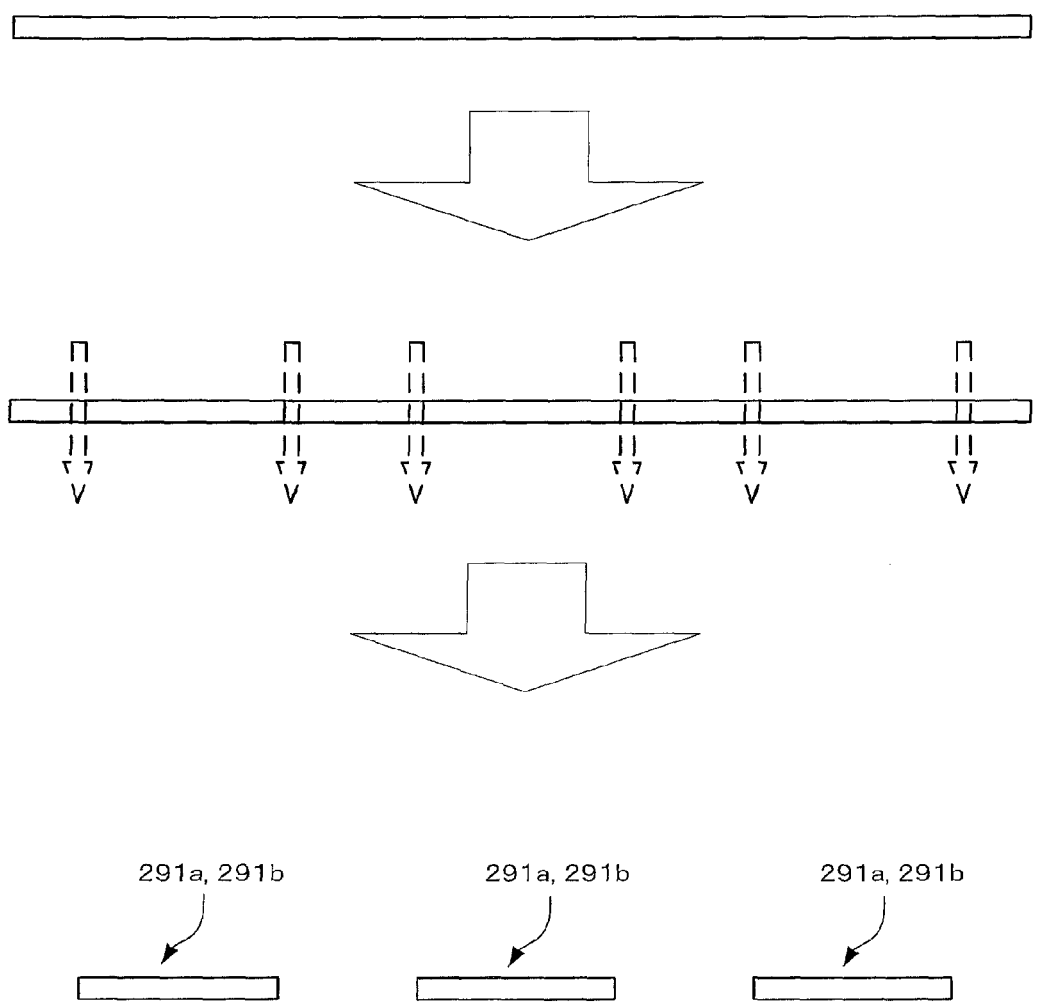
FIG. 10 is views to illustrate a step to cut out first separators.
Figure 11:
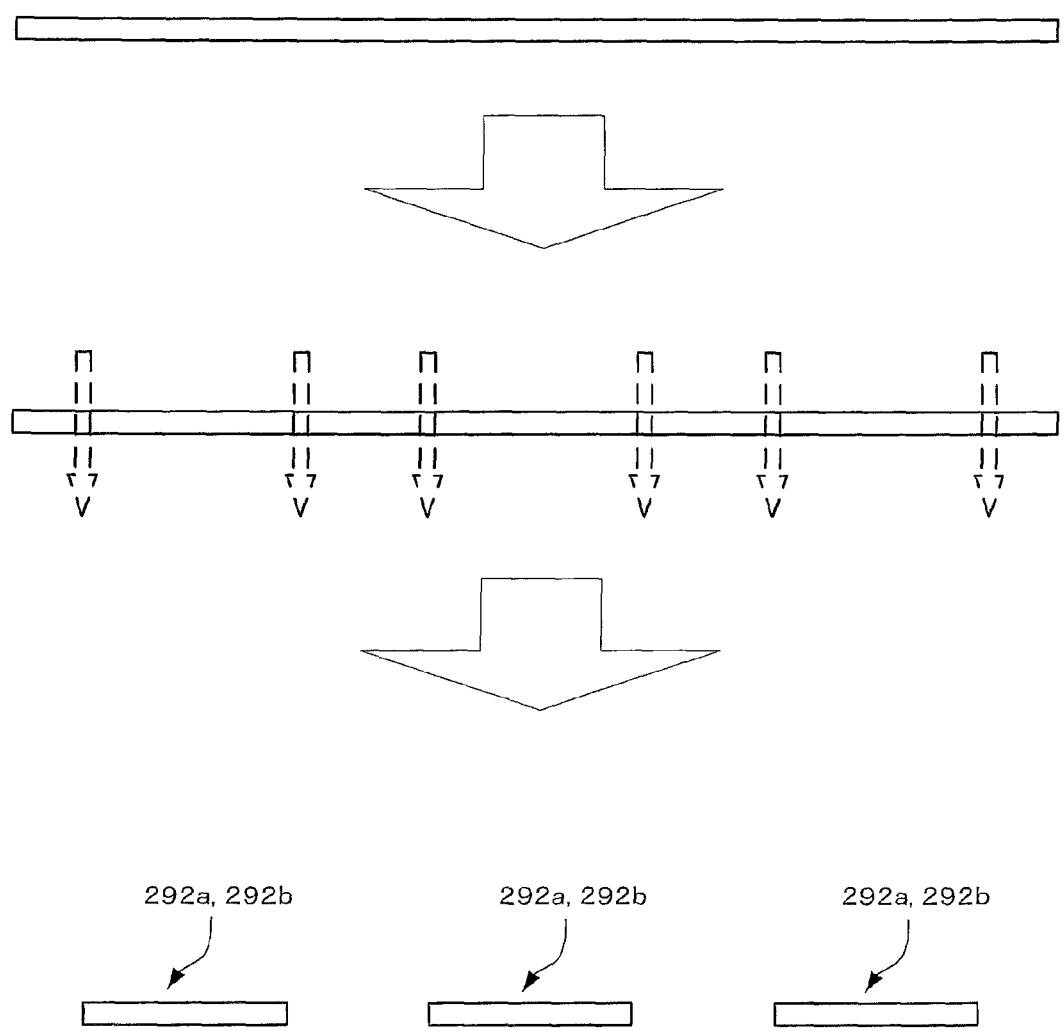
FIG. 11 is views to illustrate a step to cut out second separators.

When bonding flexible wiring board 13 and first and second rigid wiring boards 11, 12, first and second insulation layers 111, 113 with a predetermined size are prepared by cutting a material commonly used for multiple products using a laser or the like as shown in FIG. 9, for example. Also, as shown in FIG. 10 for example, first separators (291a, 291b) with a predetermined size are prepared by a laser or the like to cut a material commonly used for multiple products. In addition, as shown in FIG. 11 for example, second separators (292a, 292b) with a predetermined size are prepared by a laser or the like to cut a material commonly used for multiple products. First separators (291a, 291b) are made of, for example, polyimide film or the like, and second separators (292a, 292b) are made of, for example, adhesive sheet or the like.

Figure 12A:
FIGS. 12A-12C are views to illustrate steps to manufacture cores for first and second rigid wiring boards.
Figure 12B:
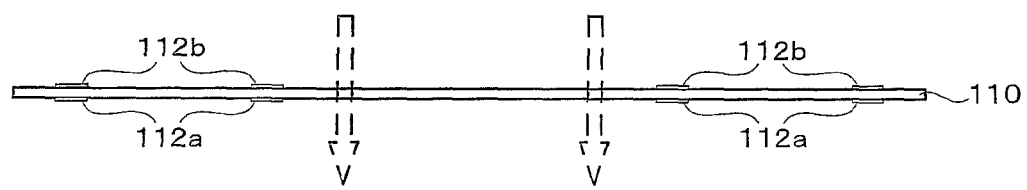
Figure 12C:
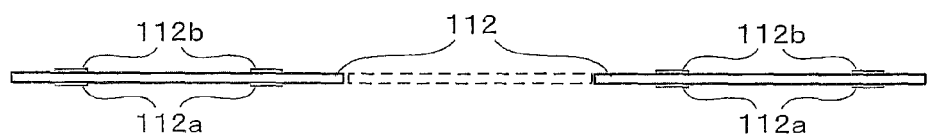

Also, rigid base material 112, which is to become a core for first and second rigid wiring boards 11, 12, is produced from wafer 110 commonly used for multiple products as shown in FIGS. 12A-12C, for example.

Namely, as shown in FIG. 12A, for example, a double-sided copper-clad laminate is prepared where conductive films (110a, 110b) made of copper are formed on front and back of wafer 110 made of glass-epoxy resin, for example. After that, as shown in FIG. 12B, for example, conductive films (110a, 110b) are each patterned by conducting, for example, a predetermined lithography process (preliminary treatment, laminating, exposing and developing, etching, removing the film, inner-layer inspection and so forth). Accordingly, conductive patterns (112a, 112b) are formed.

In the following, as shown in FIG. 12C, for example, a predetermined portion of wafer 110 is removed using a laser or the like, and rigid base materials 112 for first and second rigid wiring boards 11, 12 are obtained. After that, conductive pattern surfaces of rigid base materials 112 manufactured as such are treated to make them roughened.

The thicknesses of first and second insulation layers 111, 113 are set to be substantially the same so that first and second rigid wiring boards 11, 12 are made symmetrical at their front and back. The thicknesses of laminated first and second separators (291a, 292a) and the thicknesses of laminated first and second separators (291b, 292b) are set to be substantially the same as the thicknesses of first and second insulation layers 111, 113 respectively. Also, the thickness of rigid base material 112 is preferred to be substantially the same as the thickness of flexible wiring board 13.

Figure 13A:
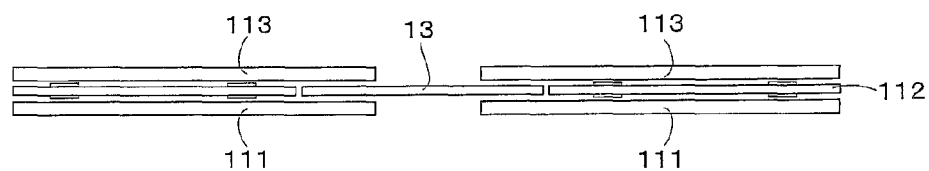
FIGS. 13A-13C are views to illustrate steps to manufacture a first layer.

In the following, first and second insulation layers 111, 113, rigid base material 112 and flexible wiring board 13 are aligned to arrange them as shown in FIG. 13A. Namely, flexible wiring board 13 is arranged to be adjacent to rigid base materials 112. In addition, the boundary areas between rigid base materials 112 and flexible wiring board 13 are coated with first and second insulation layers 111, 113. At that time, each tip of flexible wiring board 13 is aligned by being sandwiched between first and second insulation layers 111, 113. The central section of flexible wiring board 13 is exposed between rigid base materials 112.

Figure 13B:
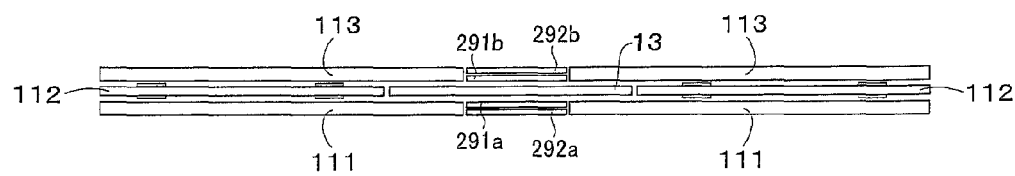

In the following, as shown in FIG. 13B, for example, first and second separators (291a, 292a) along with first and second separators (291b, 292b) are arranged on both surfaces of the central section of flexible wiring board 13 respectively to be positioned horizontal to first and second insulation layers 111, 113.

Figure 13C:
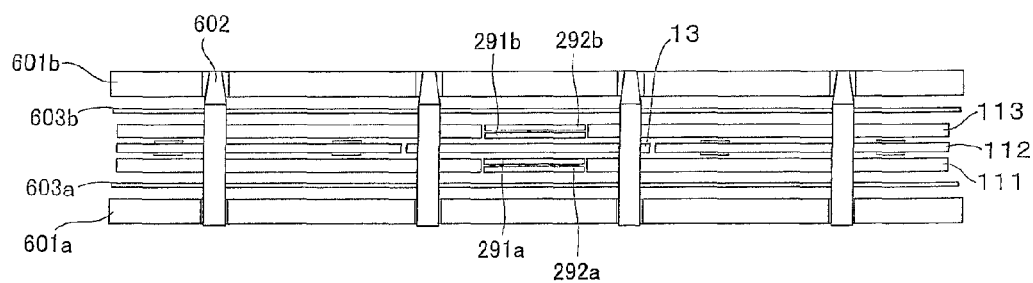

Next, after being aligned as such, the above structure is sandwiched between pressing devices (601a, 601b) as shown in FIG. 13C, for example, and thermopressed, for example, for a few seconds. At that time, devices (601a, 601b) are aligned using pins 602. In doing so, the above structure is pressed in a direction substantially perpendicular to its main surfaces. In addition, to prevent devices (601a, 601b) and the structure being adhered from becoming undetachable after the pressing, films (603a, 603b) such as PET (PolyEthylene Terephthalate) are sandwiched between devices (601a, 601b) and the structure prior to such pressing.

Figure 14A:
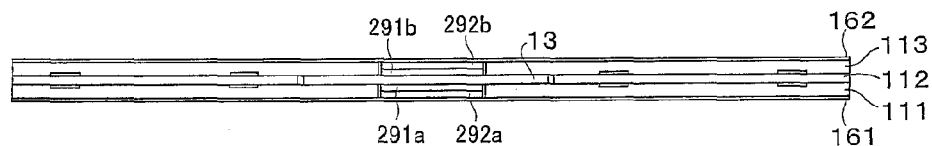
FIGS. 14A-14D are views to illustrate steps to manufacture a first layer.

In the following, conductive films 161, 162 made of, for example, copper, are arranged outside (on the front and back, respectively, of) the above structure, which is then pressure-pressed as shown in FIG. 14A. The pressure-pressing is conducted using, for example, hydraulic pressing equipment, under the approximate conditions of temperature 200° C., pressure 40 kgf and pressing time 3 hours. By doing so, resin 125 (FIG. 4) is squeezed from each prepreg forming first and second insulation layers 111, 113. Namely, gaps between rigid base materials 112 and flexible wiring board 13 are filled with resin 125. As such, by filling resin 125 in the gaps, flexible wiring board 13 and rigid base materials 112 are adhered securely. Also, during the pressing, since first and second separators (291a, 291b) and (292a, 292b) support conductive films 161, 162, problems such as torn copper foil may be prevented or suppressed.

In the following, by heating or the like the above structure, the prepreg that forms first and second insulation layers 111, 113 and resin 125 are cured and integrated. By doing so, coverlays 138, 139 (FIG. 4) of flexible wiring board 13 and the resin of first and second insulation layers 111, 113 will be polymerized.

Figure 14B:
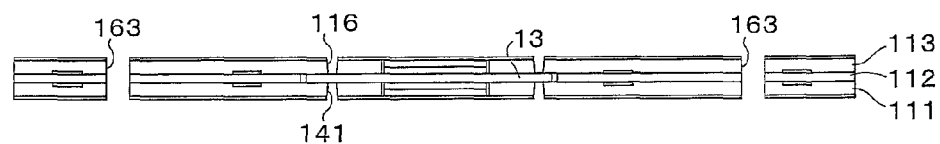

Next, after the predetermined preliminary treatment, for example, via holes 116, 141 and through-holes 163 are formed, for example, by beaming a $CO_2$ laser from $CO_2$ laser processing equipment, as shown in FIG. 14B.

Figure 14C:
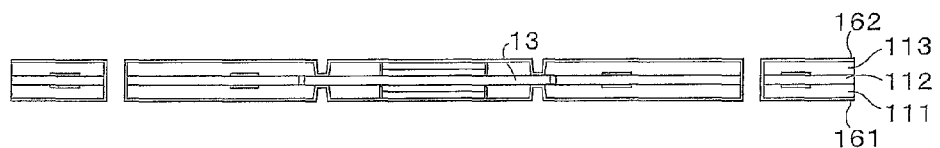

In the following, after desmearing (removing smears) and soft-etching, PN plating (such as chemical copper plating and copper electroplating), for example, is performed as shown in FIG. 14C. During that time, since flexible wiring board 13 is coated with conductive films 161, 162, flexible wiring board 13 will not be damaged by the plating solution. By such plating, conductive films 161, 162 will be formed on the entire surfaces of the wiring board including the interiors of via holes 116, 141 and through-holes 163. Part of conductive films 161, 162 will be thickened since copper from the copper plating and the copper already residing there become integrated.

Figure 14D:
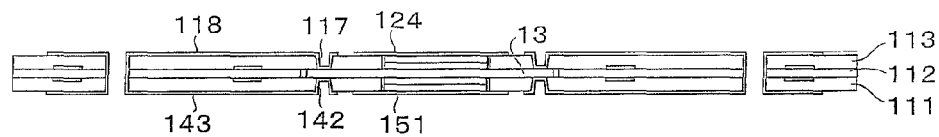

In the following, by conducting, for example, a predetermined lithography process (preliminary treatment, laminating, exposing and developing, etching, removing the film, inner-layer inspection and so forth), conductive films 161, 162 are patterned as shown in FIG. 14D. In doing so, wiring patterns 142, 117, extended patterns 143, 118 as well as conductive patterns 151, 124 (FIG. 4) are formed. Namely, such a treatment corresponds to the treatment in step (S13) in FIG. 7. After that, the copper-foil surfaces are treated to make them roughened.

Figure 15A:
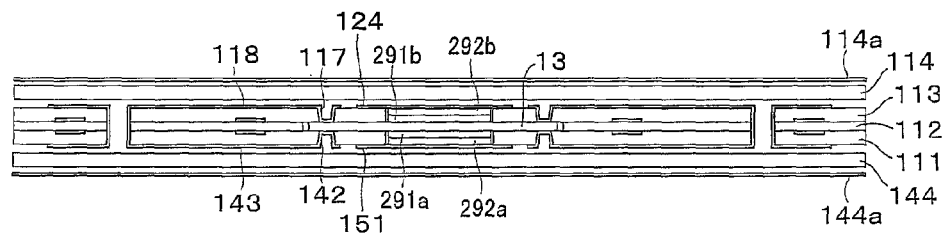
FIGS. 15A-15D are views to illustrate steps to manufacture a second layer.
Figure 15B:
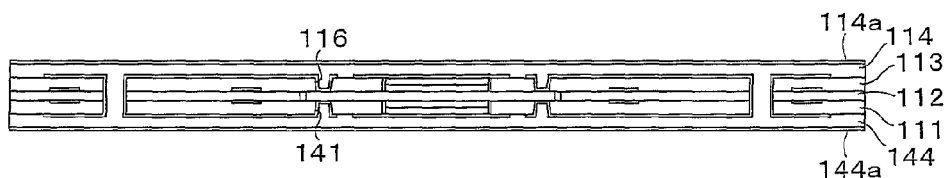

In the following, first and second upper-layer insulation layers 144, 114 are arranged on the front and back of the wiring board as shown in FIG. 15A, for example. Then, further outside, conductive films (114a, 144a) made of copper, for example, are arranged. After that, the structure is pressure-pressed as shown in FIG. 15B. During that time, resin from each prepreg that forms first and second upper-layer insulation layers 114, 144 fills via holes 116, 141. Then, by thermal treatment or the like, the prepreg and the resin inside the via holes are cured, and first and second upper-layer insulation layers 144, 114 are cured.

Figure 15C:
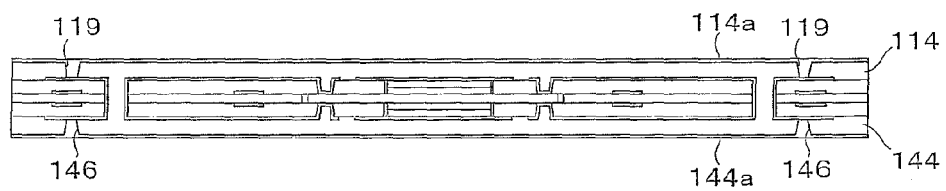

In the following, conductive films (114a, 144a) are made thinner to a predetermined thickness by, for example, half-etching. Then, as shown in FIG. 15C, after a predetermined preliminary treatment, via holes 146 are formed in first upper-layer insulation layer 144, and via holes 119 are formed in second upper-layer insulation layer 114, using a laser or the like. Then, after desmearing (removing smears) and soft-etching, PN plating (such as chemical copper plating and copper electroplating) is performed. By doing so, conductive films (114a, 144a) are formed on the entire surfaces of the wiring board including via holes 146, 119. Part of conductive films (114a, 144a) will be thickened, since copper from the copper plating and the conductive film already residing there become integrated. Here, conductive films (114a, 144a) may also be formed by screen-printing conductive paste (such as thermosetting resin containing conductive particles).

Figure 15D:
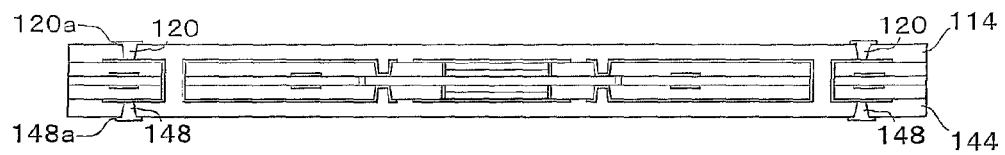

In the following, conductive films on the wiring surfaces are made thinner to a predetermined thickness by, for example, half-etching. Then, as shown in FIG. 15D, for example, conductive films (114a, 144a) on the surfaces of the wiring board are each patterned by conducting, for example, a predetermined process (preliminary treatment, laminating, exposing and developing, etching, removing the film, inner-layer inspection and so forth). Accordingly, conductors 148, 120 and conductive patterns (148a, 120a) are formed. Namely, such a process also corresponds to step (S13) in FIG. 7. After that, the surfaces of conductors 148, 120 are treated to make them roughened.

Figure 16A:
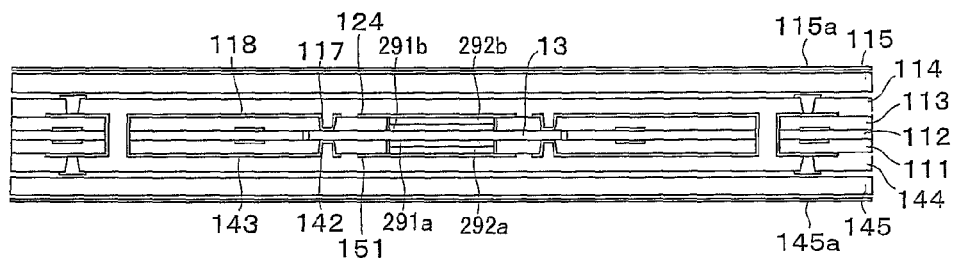
FIGS. 16A-16D are views to illustrate steps to manufacture a third layer.

In the following, third and fourth upper-layer insulation layers 145, 115 are arranged on the front and back of the wiring board as shown in FIG. 16A, for example. Then, on the outer sides (on the front and back respectively), conductive films (145a, 115a) made of copper, for example, are arranged. After that, by heating or the like, third and fourth upper-layer insulation layers 145, 115 are cured. Here, third and fourth upper-layer insulation layers 145, 115 are formed with prepreg or the like made by, for example, impregnating glass cloth with resin.

Figure 16B:
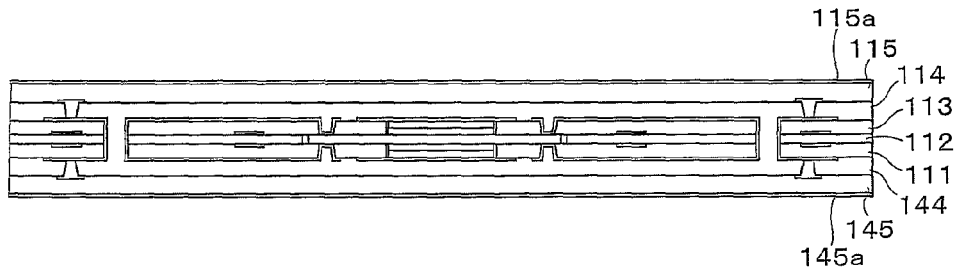
Figure 16C:
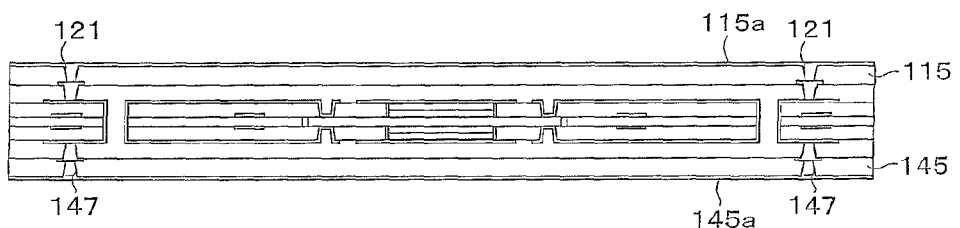

In the following, the wiring board is pressed as shown in FIG. 16B. After that, conductive films (145a, 115a) are made thinner to a predetermined thickness by, for example, half-etching. Then, after conducting a predetermined preliminary treatment, via holes 147, 121 are formed using a laser or the like in third and fourth upper-layer insulation layers 145, 115 respectively. Then, after desmearing (removing smears) and soft-etching, PN plating (such as chemical copper plating and copper electroplating), for example, is performed as shown in FIG. 16C. In doing so, conductive films (145a, 115a) will be formed on the entire surfaces of the wiring board including the interiors of via holes 147, 121. Part of conductive films (145a, 115a) will be thickened since copper from the copper plating and the copper already residing there become integrated. As such, by filling via holes 147, 121 with the same conductive paste material (for example, copper), connection reliability may be enhanced when via holes 147, 121 receive thermal stresses. Here, conductive films (145a, 115a) may also be formed by screen-printing conductive paste (such as thermosetting resin containing conductive particles).

Figure 16D:
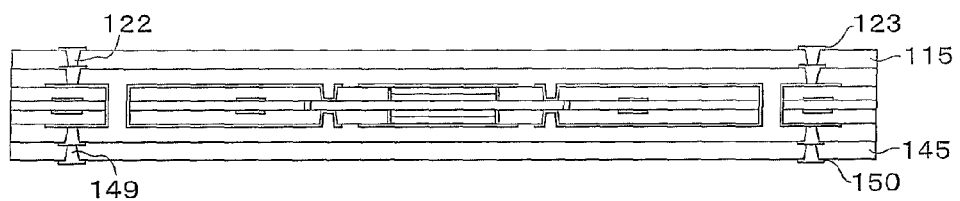

In the following, conductive films (145a, 115a) on the wiring-board surfaces are made thinner to a predetermined thickness by, for example, half-etching. After that, as shown in FIG. 16D, for example, conductive films (145a, 115a) on the surfaces of the wiring boards are each patterned by conducting, for example, a predetermined lithography process (preliminary treatment, laminating, exposing and developing, etching, removing the film, inner-layer inspection and so forth). Accordingly, conductors 149, 122 and conductive patterns 150, 123 are formed. Namely, such a process also corresponds to step (S13) in FIG. 7. After that, the surfaces of conductors 150, 123 are treated to make them roughened.

Figure 17A:
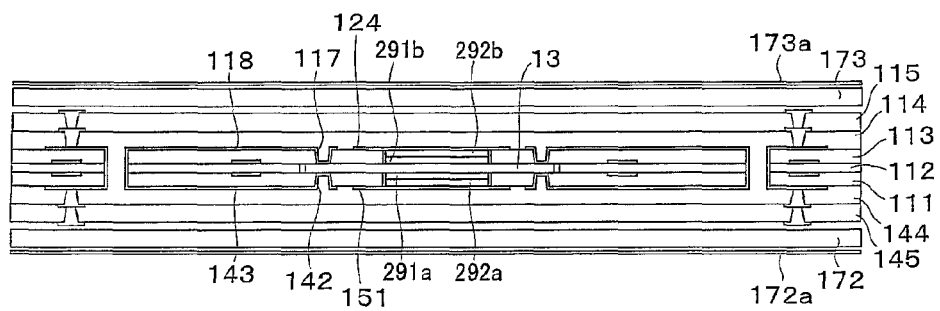
FIGS. 17A-17C are views to illustrate steps to manufacture a fourth layer.

In the following, fifth and sixth upper-layer insulation layers 172, 173 are formed on the front and back of the wiring board as shown in FIG. 17A. Then, on the outer sides (on the front and back respectively), conductive films (172a, 173a) made of copper, for example, are arranged. Here, fifth and sixth upper-layer insulation layers 172, 173 are formed with prepreg or the like made by, for example, impregnating glass cloth with resin.

Figure 17B:
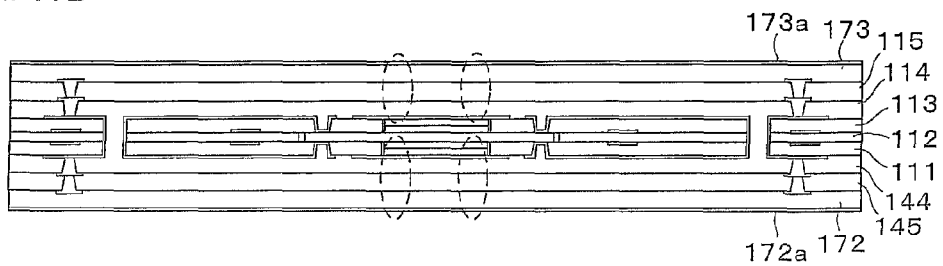
Figure 17C:
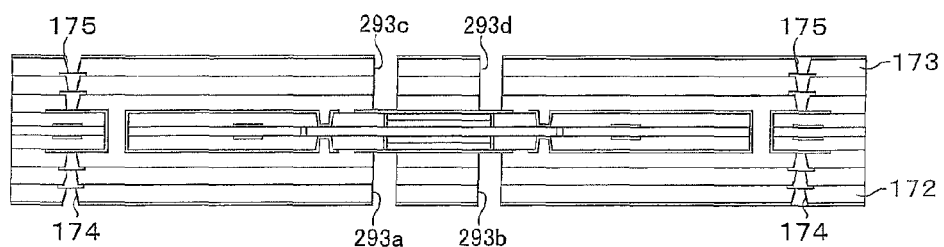

In the following, the wiring board is pressed as shown in FIG. 17B. After that, conductive films (172a, 173a) are made thinner to a predetermined thickness by, for example, half-etching. Then, after conducting a predetermined preliminary treatment, via holes 174, 175 are formed using a laser or the like in fifth and sixth upper-layer insulation layers 172, 173 respectively, as shown in FIG. 17C. Meanwhile, portions of insulation layers indicated by broken lines in FIG. 17B are removed to form cutting lines (293a-293d). During that time, conductive patterns 151, 124, for example, are used as stoppers. Also, by adjusting the beaming energy or beaming time of the laser, conductive patterns 151, 124 may be cut to a certain degree.

Figure 18A:
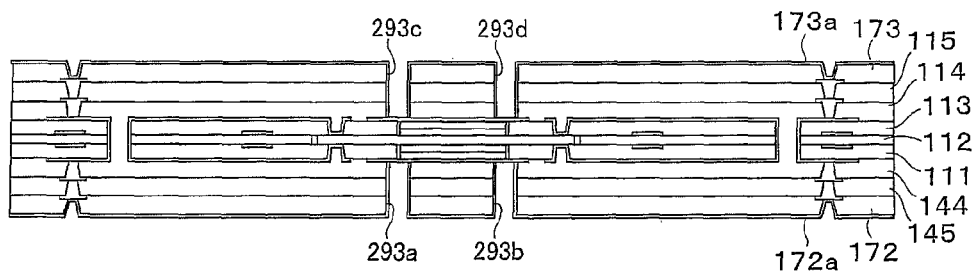
FIGS. 18A-18C are views to illustrate steps to manufacture a fourth layer.

In the following, as shown in FIG. 18A, PN plating (such as chemical copper plating and copper electroplating) is performed. By doing so, conductive films (172a, 173a) are formed on the entire surfaces of the wiring board including the interiors of via holes 174, 175 and the interiors of cutting lines (293a-293d). Part of conductive films (172a, 173a) will be thickened, since copper from the copper plating and the conductive film already residing there become integrated.

Figure 18B:
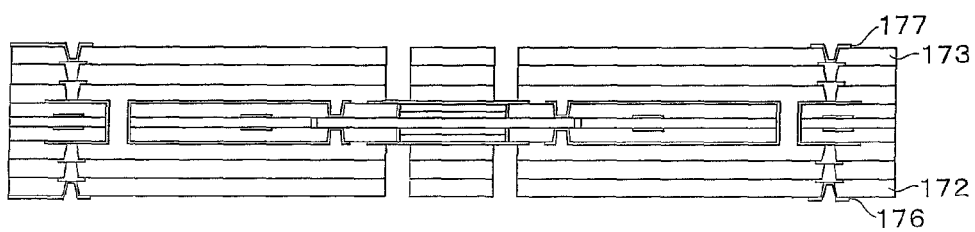

In the following, conductive films on the surfaces of the wiring board are made thinner to a predetermined thickness by, for example, half-etching. After that, as shown in FIG. 18B, for example, conductive films (172a, 173a) on the surfaces of the wiring boards are patterned by conducting, for example, a predetermined lithography process (preliminary treatment, laminating, exposing and developing, etching, removing the film and so forth). Accordingly, conductive patterns 176, 177 are formed. Namely, such a process also corresponds to step (S13) in FIG. 7. After forming the patterns, such patterns will be inspected.

Figure 18C:
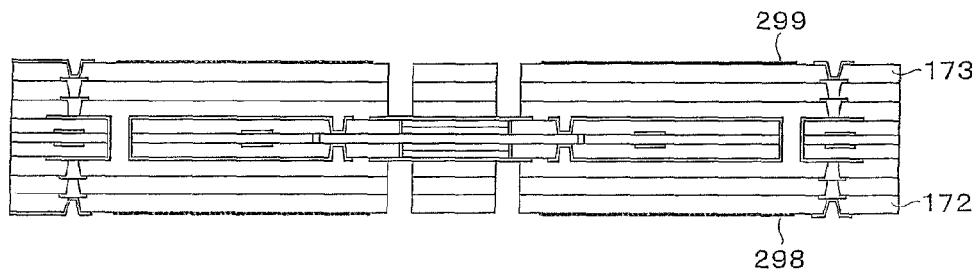

In the following, as shown in FIG. 18C, solder resists 298, 299 are formed on the surfaces of the wiring board by screen-printing, for example. Also, according to requirements, solder resists 298, 299 are properly patterned. After that, by heating or the like, solder resists 298, 299 are cured.

Figure 19A:
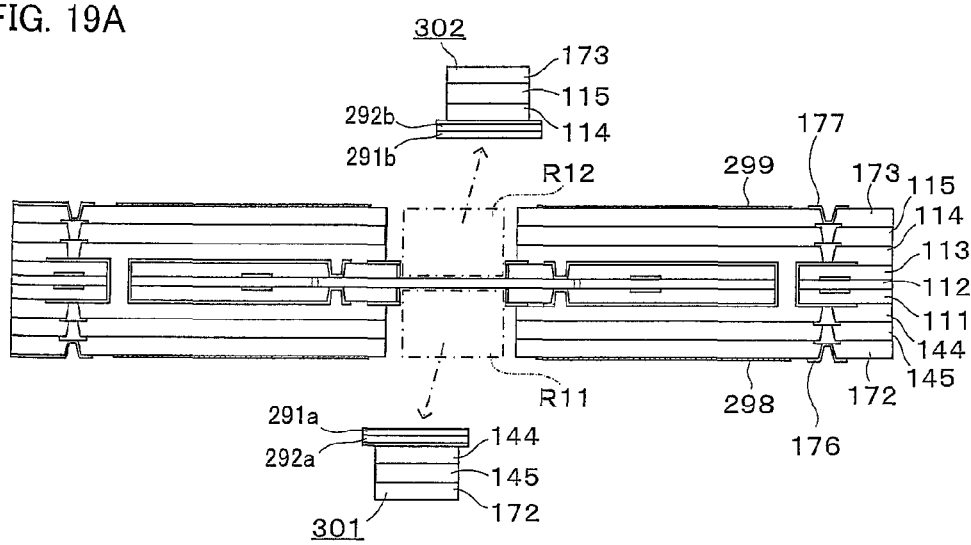
FIG. 19A is a view to illustrate steps to expose part (a central portion) of a flexible wiring board.

In the following, after conducting hole drilling or external processing according to requirements, as shown in FIG. 19A, structures 301, 302 are removed by peeling them from flexible wiring board 13. During that time, since first separators (291a, 291b) are arranged there, separation may be conducted easily. Accordingly, by exposing the central section of flexible wiring board 13, spaces (regions (R11, R12) in FIG. 19A), which allow flexible wiring board 13 to warp (bend), are formed on the front and back of flexible wiring board 13 (in directions to laminate insulation layers). Thus, flex-rigid wiring board 10 may be bent or the like at such sections of flexible wiring board 13.

Figure 19B:
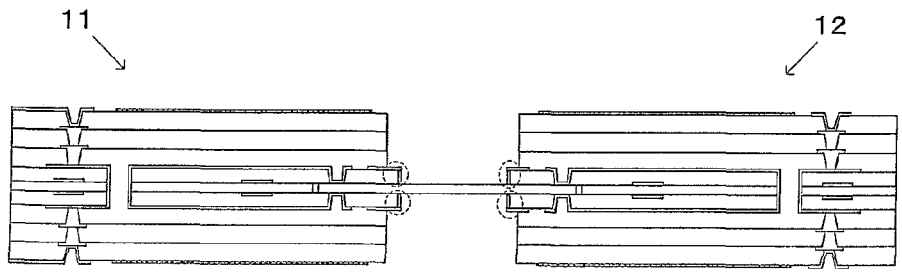
FIG. 19B is a view showing the flex-rigid wiring board after the central portion of the flexible wiring board has been exposed.
Figure 19C:
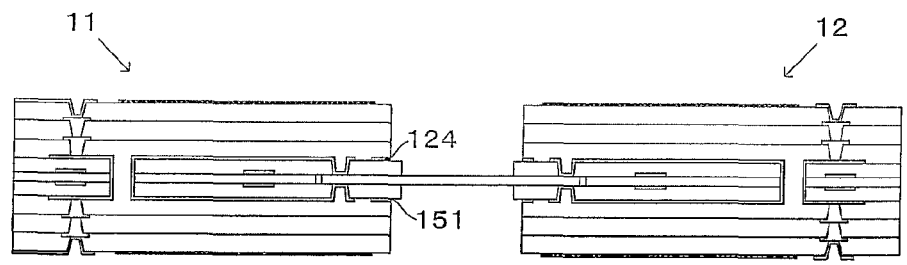
FIG. 19C is a view showing the flex-rigid wiring board after the central portion of the flexible wiring board has been exposed, and then remaining conductors are removed.

After structures 301, 302 are removed, conductors remain as indicated by broken lines in FIG. 19B, for example. Such remaining conductors will be removed according to requirements by, for example, mask-etching, as shown in FIG. 19C.

Accordingly, flexible wiring board 13 and first and second rigid wiring boards 11, 12 are bonded. In the following, electrodes 178, 179 (FIG. 3) are formed by, for example, chemical gold plating. Then, after exterior processing, warping correction, conductivity inspection, an external-appearance inspection and a final inspection, flex-rigid wiring board 10 is completed as previously shown in FIG. 1.

According to the manufacturing method of the present embodiment, flex-rigid wiring board 10 is manufactured in such a way that the configuration of flexible wiring board 13 is not changed; namely, flexible wiring board 13 is spread on a planar surface as previously shown in FIG. 1. In doing so, when manufacturing flex-rigid wiring board 10 (especially during a pressing step), stresses exerted onto the wiring patterns (conductive layers 132, 133) of flexible wiring board 13 will be eased. Also, after flex-rigid wiring board 10 is manufactured and electronic components 501, 502 are mounted (FIG. 5), flexible wiring board 13 may be extended by being folded at folding sections (13a-13c), namely, by being configured to be such as shown in FIG. 6.

So far, a flex-rigid wiring board and its manufacturing method according to an embodiment of the present invention have been described. However, the present invention is not limited to such an embodiment.

Figure 20:
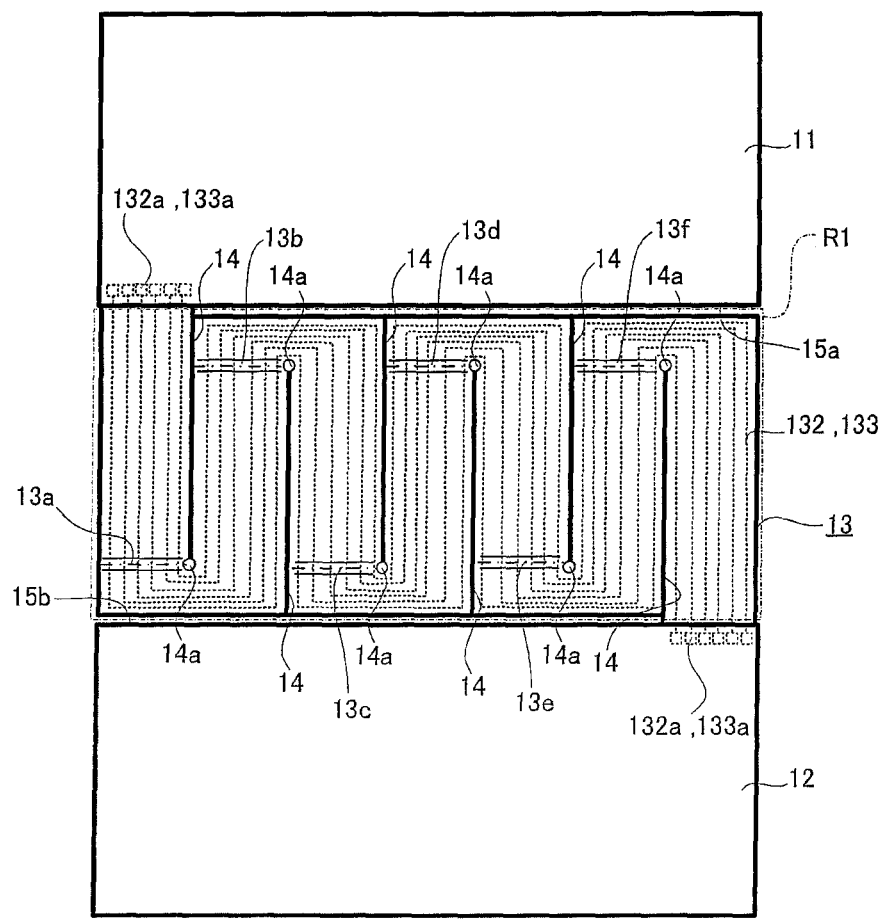
FIG. 20 is a view showing another embodiment of a flexible wiring board.
Figure 21:
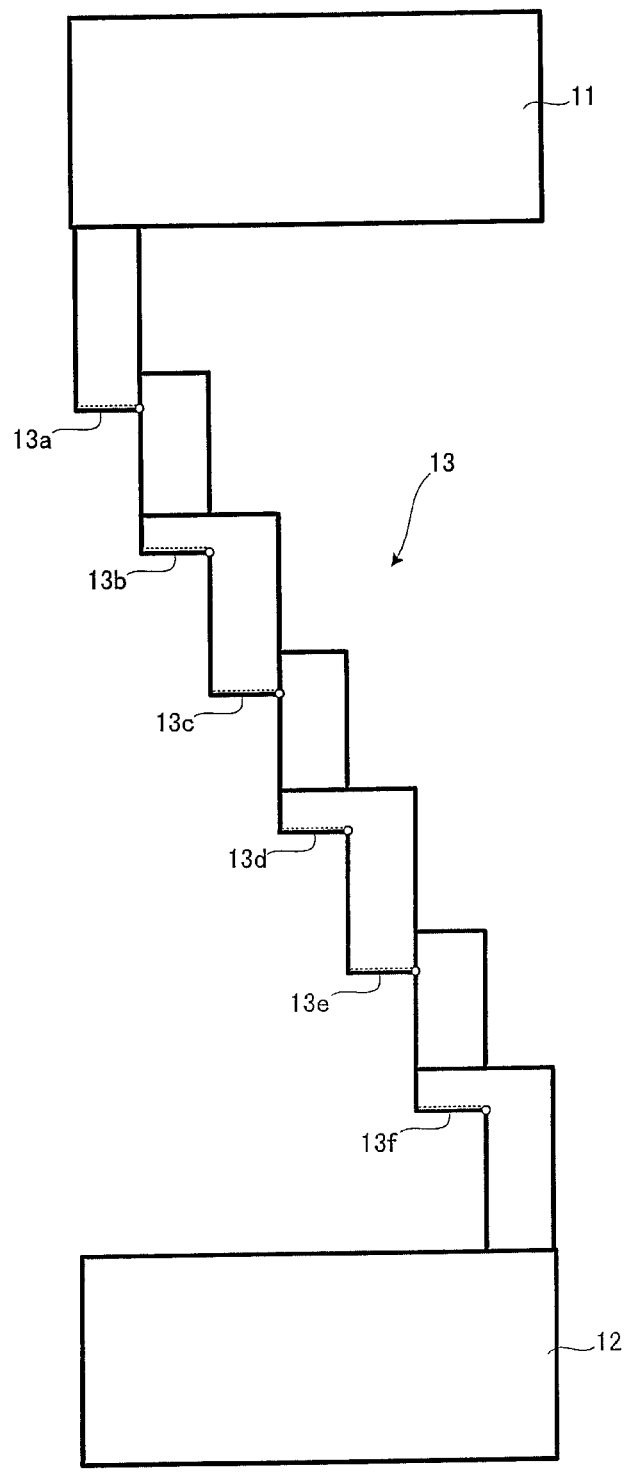
FIG. 21 is a view showing an extended state of the flex-rigid wiring board shown in FIG. 20.

Flexible wiring board 13 may be configured to be such as shown in FIG. 20. Flexible wiring board 13 here has a zigzag configuration. Namely, in rectangular flexible wiring board 13, multiple cuts 14 are made parallel to directions in which first and second rigid wiring boards 11, 12 are connected to flexible wiring board 13. In region (R1) between first rigid wiring board 11 and second rigid wiring board 12, flexible wiring board 13 extends from second rigid wiring board 12 toward first rigid wiring board 11 and makes a U-turn before the side of first rigid wiring board 11, then extends this time toward second rigid wiring board 12 and makes a U-turn before the side of rigid wiring board 12, and then extends toward first rigid wiring board 11 again. By repeating such, flexible wiring board 13 will cover substantially the entire rectangular region (R1) in a zigzag configuration. Flexible wiring board 13 has folding sections (13a-13f). In folding sections (13a-13f), shielding layers 136, 137 (FIG. 2) are removed. By folding flexible wiring board 13 at folding sections (13a-13f), flexible wiring board 13 is extended to be longer than it was before folding, as shown in FIG. 21. In such an example, flexible wiring board 13 becomes extended in a staircase configuration. Substantially the same effects are achieved in a flexible wiring board with such a configuration, as in flexible wiring board 13 shown in FIG. 1.

In such embodiments or modified examples, shielding layers 136, 137 are removed from folding sections (13a-13f). However, the present invention is not limited to such. By removing other layers such as coverlays 138, 139, flexible wiring board 13 becomes thinner, and thus it may be bent easily. Also, two or more layers may be removed. Alternatively, depending on material or the like of flexible wiring board 13, folding sections may be omitted if they are not necessary.

In the above embodiments or modified examples, examples were shown in which flexible wiring board 13 covers substantially the entire region (R1) (see FIGS. 1 and 20). However, the present invention is not limited to such. According to usage requirements or the like, by making the width of flexible wiring board 13 smaller, for example, flexible wiring board 13 may be arranged only in a predetermined portion of region (R1).

Figure 22:
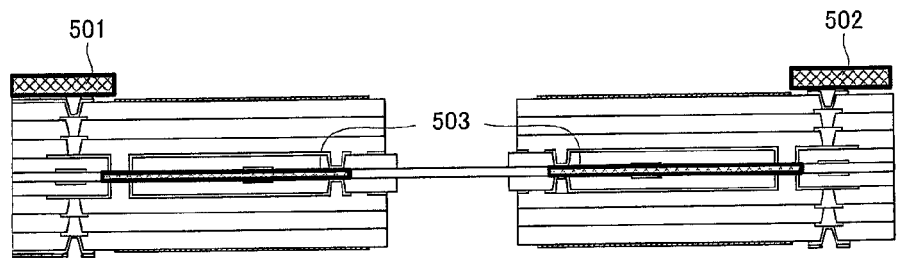
FIG. 22 is a cross-sectional view showing an example of a flex-rigid wiring board with built-in electronic components.

As shown in FIG. 22, in addition to electronic components 501, 502 mounted on the surface of flex-rigid wiring board 10, electronic component 503 may also be accommodated inside flex-rigid wiring board 10. Using such flex-rigid wiring board 10 with a built-in electronic component, electronic devices may become highly functional.

The material and size of each layer and the number of layers may be modified in the above embodiments. For example, instead of prepreg, RCF (Resin Coated Copper Foil) may also be used.

Figure 23A:
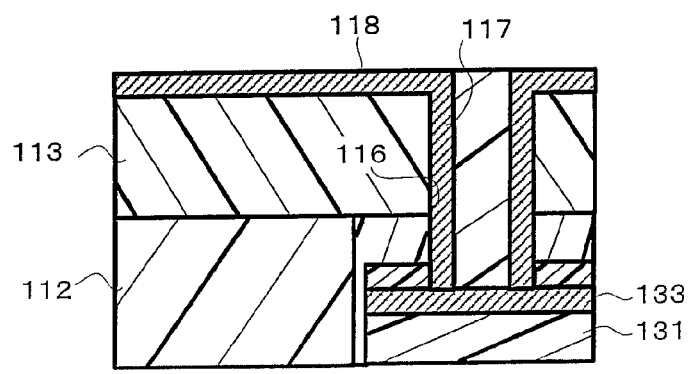
FIG. 23A is a view showing a connection structure between a rigid wiring board and a flexible wiring board.
Figure 23B:
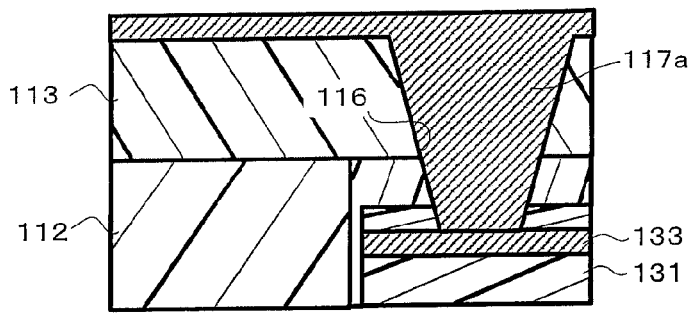
FIG. 23B is a view showing a modified example of the connection structure between a rigid wiring board and a flexible wiring board.

Also, in the above embodiments, first and second rigid wiring boards 11, 12 and flexible wiring board 13 were electrically connected by means of conformal vias as previously shown in FIG. 4. However, the present invention is not limited to such. For example, as shown in FIG. 23A, both wiring boards may be connected by means of through-holes. However, if such a structure is employed, the impact of being dropped or the like may concentrate on the inner-wall portions of through-holes. Thus, cracks may tend to occur at the shoulder portions of through-holes, compared with conformal vias. Alternatively, as shown in FIG. 23B for example, via holes 116 may be filled with conductor (117a) so that both wiring boards are connected by means of filled vias. If such a structure is employed, portions receiving impact from being dropped or the like will be the entire vias, thus reducing the occurrence of cracks compared with conformal vias. Furthermore, conductive resin may be filled in the above conformal vias or through-holes.

Figure 24:
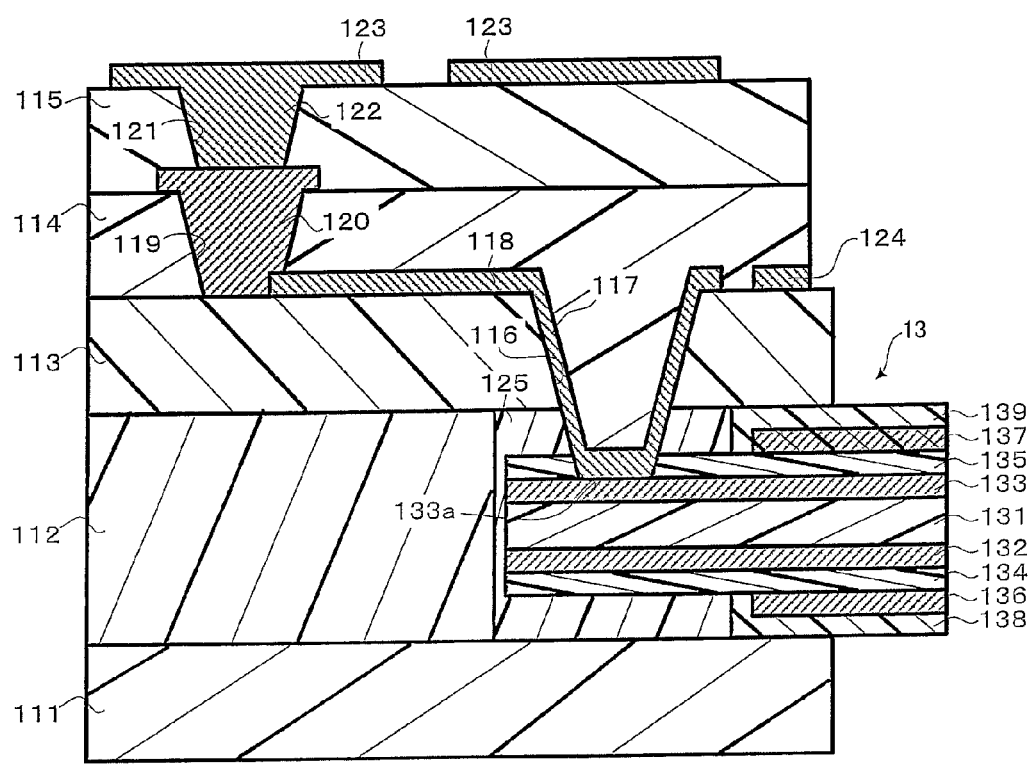
FIG. 24 is a cross-sectional view showing a modified example of a flex-rigid wiring board.

As shown in FIG. 24, a flex-rigid wiring board may be a structure to have conductors (wiring layers) only on either the front or back of the core in first rigid wiring board 11 or second rigid wiring board 12.

Figure 25:
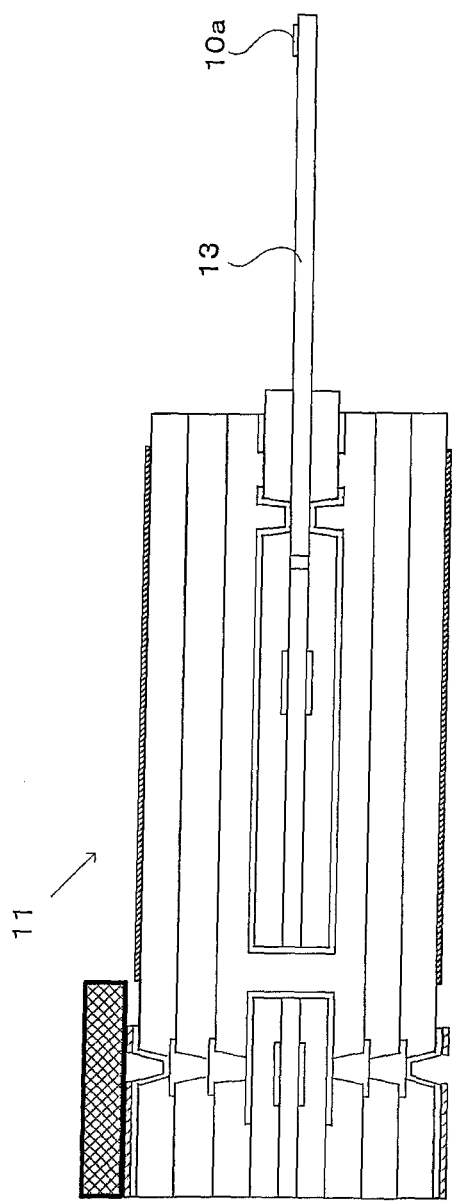
FIG. 25 is a view showing an example of a flex-rigid wiring board having a flying-tail structure.

Three or more rigid wiring boards may be connected to flexible wiring board 13. Alternatively, as shown in FIG. 25, a structure may be employed in such a way that second rigid wiring board 12 is omitted and flexible wiring board 13 protrudes like a tail from first rigid wiring board 11, for example. Namely, a so-called flying tail structure may be employed. In an example shown in FIG. 25, part of an inner-layer pattern is extended from first rigid wiring board 11 to form terminal (10a) at the tip of flexible wiring board 13. Terminal (10a) allows electrical connection with other wiring boards or apparatuses.

The order of the steps in the above embodiments may be modified within a scope that will not deviate from the gist of the present invention. Also, according to usage requirements or the like, unnecessary steps may be omitted.

Figure 26:
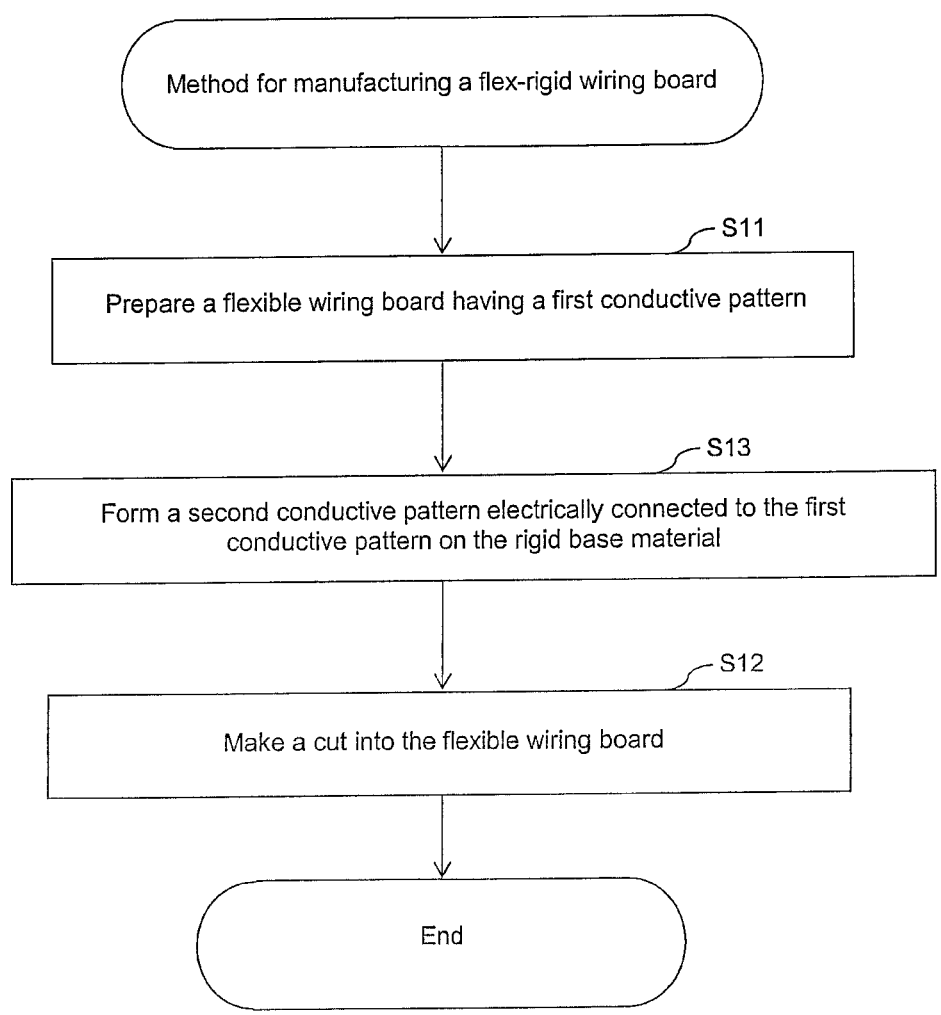
FIG. 26 is a flow chart showing a modified example of a method for manufacturing a flex-rigid wiring board.
Figure 27:
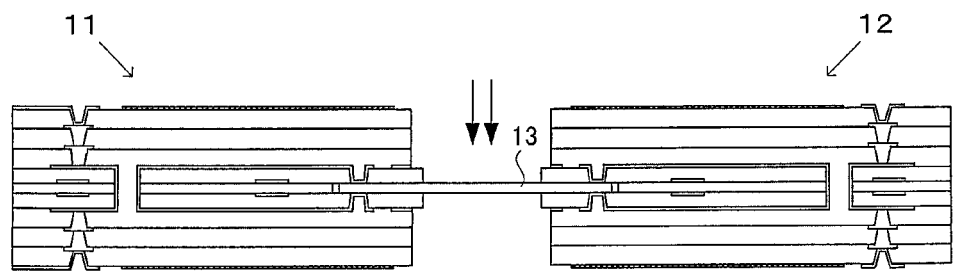
FIG. 27 is a view showing a modified example of a method for manufacturing a flex-rigid wiring board.

For example, as shown in FIG. 26, step (S12) and step (S13) in FIG. 7 may be switched with each other. Namely, cuts 14 are not formed in a step shown in FIG. 8F; instead, after the step shown in FIG. 19C, cuts 14 may be formed as shown in FIG. 27.

A flex-rigid wiring board according to one aspect of the present invention has a flexible wiring board having a first conductive pattern on a flexible base material, and a rigid wiring board having a second conductive pattern on a rigid base material. The first conductive pattern and the second conductive pattern are electrically connected to each other, a cut is formed in the flexible base material, and, by being folded at the cut, the flexible wiring board is extended to be longer than it was before folding.

The electrical connection includes, for example, connection by means of any conductive material, plating connection, via connection, through-hole connection or the like. Also, the first conductive pattern on the flexible base material and the second conductive pattern on the rigid base material include not only the conductive patterns directly formed on the flexible base material or the rigid base material, but also conductive patterns formed on further upper layers, namely, conductive patterns laminated on one side or both sides of the flexible base material or the rigid base material by means of insulation layers.

A method for manufacturing a flex-rigid wiring board according to another aspect of the present invention has the following steps: a step to prepare a flexible wiring board having a first conductive pattern on a flexible base material; a step to make a cut in the flexible base material; and a step to form on a rigid base material a second conductive pattern electrically connected to the first conductive pattern.

The first to third steps may be conducted in any order, except when a certain order is specified. Also, the preparation step (first step) includes a case to purchase materials and parts and manufacture accordingly, as well as a case to purchase finished products and use them.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a flex-rigid wiring board, comprising:

preparing a flexible wiring board comprising a flexible base material and having a conductive layer over the flexible base material;

making at least one cut in the flexible wiring board such that the flexible wiring board has at least one cut portion formed;

forming an insulation layer over the flexible wiring board, a first rigid wiring board and a second rigid wiring board comprising a rigid base material and a conductive layer formed over the rigid base material such that the first rigid wiring board and the second rigid wiring board are connected through the flexible wiring board at opposite end portions of the flexible wiring board after the making of the cut in the flexible wiring board;

removing a portion of the insulation layer from the flexible wiring board such that the cut portion of the flexible wiring board is exposed and that a flex-rigid board structure having a flexible section comprising the flexible wiring board and a rigid section comprising the first and second rigid wiring boards is formed; and forming at least one folding portion in the flexible section of the flex-rigid board structure using the cut portion of the flexible wiring board such that the flex-rigid board structure is extended in length, wherein the cut in the flexible wiring board is formed to extend in a line perpendicular to a direction in which the first rigid wiring board and the second rigid wiring board are connected to the flexible wiring board.

2. The method for manufacturing a flex-rigid wiring board according to claim 1, wherein the making of the cut comprises beveling a tip of the cut portion.

3. The method for manufacturing a flex-rigid wiring board according to claim 1, further comprising removing a portion of the flexible wiring board such that the folding portion of the flex-rigid board structure is made more bendable than a remaining portion of the flexible section of the flex-rigid board structure.

4. The method for manufacturing a flex-rigid wiring board according to claim 3, wherein the flexible wiring board has a laminated structure, and the removing of a portion of the flexible wiring board comprises removing a predetermined layer from the laminated structure.

5. The method for manufacturing a flex-rigid wiring board according to claim 3, wherein the flexible wiring board has a laminated structure including an electromagnetic-wave shielding layer, and the removing of a portion of the flexible wiring board comprises removing a portion of the shielding layer from the folding portion.

6. The method for manufacturing a flex-rigid wiring board according to claim 1, wherein the forming of the insulation layer comprises forming a rigid wiring board portion at an end portion of the flexible wiring board.

7. The method for manufacturing a flex-rigid wiring board according to claim 1, wherein the forming of the insulation layer comprises electrically connecting the conductive layer of the second rigid wiring board to the conductive layer of the flexible wiring board.

8. The method for manufacturing a flex-rigid wiring board according to claim 1, wherein the forming of the insulation layer comprises positioning the flexible wiring board adjacent to the rigid base material and covering the rigid base material and at least a portion of the flexible wiring board.

9. The method for manufacturing a flex-rigid wiring board according to claim 8, further comprising:
   forming a conductive layer over the insulation layer;
   forming a via hole opening which penetrates the insulation layer and extends to the conductive layer of the flexible wiring board; and
   filling the via hole opening with a conductor such that the conductive layer formed over the insulation layer is connected to the conductive layer of the flexible wiring board.

10. The method for manufacturing a flex-rigid wiring board according to claim 1, further comprising covering a portion of the flexible wiring board including the cut portion with a separator layer.

11. The method for manufacturing a flex-rigid wiring board according to claim 1, further comprising covering a portion of the flexible wiring board including the cut portion with a separator layer, wherein the removing the portion of the insulation layer includes removing the separator layer from the portion of the flexible wiring board.

12. The method for manufacturing a flex-rigid wiring board according to claim 1, further comprising covering a portion of the flexible wiring board including the cut portion with a separator layer, wherein the forming of the insulation layer comprises forming the insulation layer over the separator layer.

13. The method for manufacturing a flex-rigid wiring board according to claim 1, further comprising:
   forming a conductive layer over the insulation layer;
   forming a via hole opening which penetrates the insulation layer and extends to the conductive layer of the flexible wiring board; and
   filling the via hole opening with a conductor such that the conductive layer formed over the insulation layer is connected to the conductive layer of the flexible wiring board.

14. The method for manufacturing a flex-rigid wiring board according to claim 1, further comprising removing a portion of the flexible wiring board such that the folding portion of the flex-rigid board structure is made more bendable than a remaining portion of the flexible section of the flex-rigid board structure, wherein the preparing of the flexible wiring board comprises forming the flexible wiring board having a laminated structure.

15. The method for manufacturing a flex-rigid wiring board according to claim 1, wherein the preparing of the flexible wiring board comprises forming the flexible wiring board having a laminated structure including an electromagnetic-wave shielding layer.

16. The method for manufacturing a flex-rigid wiring board according to claim 1, wherein the preparing of the flexible wiring board comprises forming the flexible wiring board having a laminated structure including an electromagnetic-wave shielding layer, and the forming of the insulation layer comprises positioning the flexible wiring board adjacent to the rigid base material and covering the rigid base material and at least a portion of the flexible wiring board.

17. The method for manufacturing a flex-rigid wiring board according to claim 1, further comprising:
   forming a conductive layer over the insulation layer;
   forming a via hole opening which penetrates the insulation layer and extends to the conductive layer of the flexible wiring board; and
   filling the via hole opening with a conductor such that the conductive layer formed over the insulation layer is connected to the conductive layer of the flexible wiring board,
   wherein the forming of the insulation layer comprises positioning the flexible wiring board adjacent to the rigid base material and covering the rigid base material and at least a portion of the flexible wiring board.

18. The method for manufacturing a flex-rigid wiring board according to claim 1, further comprising covering a portion of the flexible wiring board including the cut portion with a separator layer, wherein the forming of the insulation layer comprises forming the insulation layer over the separator layer, and the forming of the insulation layer comprises positioning the flexible wiring board adjacent to the rigid base material and covering the rigid base material and at least a portion of the flexible wiring board.

19. The method for manufacturing a flex-rigid wiring board according to claim 1, further comprising covering a portion of the flexible wiring board including the cut portion with a separator layer, wherein the removing the portion of the insulation layer includes removing the separator layer from the portion of the flexible wiring board, and the forming of the insulation layer comprises positioning the flexible wiring board adjacent to the rigid base material and covering the rigid base material and at least a portion of the flexible wiring board.

20. The method for manufacturing a flex-rigid wiring board according to claim 1, further comprising covering a portion of the flexible wiring board including the cut portion with a separator layer, wherein the forming of the insulation layer comprises positioning the flexible wiring board adjacent to the rigid base material and covering the rigid base material and at least a portion of the flexible wiring board.

* * * * *